(12) United States Patent
Hayashi

(10) Patent No.: US 8,093,619 B2
(45) Date of Patent: Jan. 10, 2012

(54) LIGHT EMITTING DEVICE

(75) Inventor: Masaki Hayashi, Anan (JP)

(73) Assignee: Nichia Corporation, Anan-shi, Tokushima (JP)

( * ) Notice: Subject to any disclaimer, the term of this patent is extended or adjusted under 35 U.S.C. 154(b) by 153 days.

(21) Appl. No.: 12/521,428

(22) PCT Filed: Dec. 26, 2007

(86) PCT No.: PCT/JP2007/074892
§ 371 (c)(1),
(2), (4) Date: Jun. 26, 2009

(87) PCT Pub. No.: WO2008/081794
PCT Pub. Date: Jul. 10, 2008

(65) Prior Publication Data
US 2010/0314654 A1    Dec. 16, 2010

(30) Foreign Application Priority Data
Dec. 28, 2006  (JP) ................................. 2006-353669

(51) Int. Cl.
*H01L 33/62* (2010.01)

(52) U.S. Cl. ..... 257/99; 257/98; 257/100; 257/E33.058; 438/26

(58) Field of Classification Search ............... 257/97, 257/98, 99, 100, 96, E33.058, E33.066; 438/26
See application file for complete search history.

(56) References Cited

U.S. PATENT DOCUMENTS

| | | | |
|---|---|---|---|
| 6,066,861 A * | 5/2000 | Hohn et al. | 257/99 |
| 6,888,174 B2 * | 5/2005 | Hohn et al. | 257/100 |
| 7,045,905 B2 * | 5/2006 | Nakashima | 257/787 |
| 2001/0022390 A1 * | 9/2001 | Waitl et al. | 257/666 |
| 2003/0132701 A1 | 7/2003 | Sato et al. | |
| 2005/0129957 A1 * | 6/2005 | Kashiwagi et al. | 428/413 |
| 2006/0163601 A1 * | 7/2006 | Harle et al. | 257/100 |

FOREIGN PATENT DOCUMENTS

| | | |
|---|---|---|
| JP | 11-45958 | 2/1999 |
| JP | 2001-177160 | 6/2001 |
| JP | 2000-520823 | 7/2002 |
| JP | 2002-520823 | 7/2002 |
| JP | 2003-224305 | 8/2003 |
| JP | 2005-294736 | 10/2005 |
| JP | 2006-156704 | 6/2006 |
| JP | 2006-339386 | 12/2006 |
| WO | WO 00/02262 | 1/2000 |

* cited by examiner

*Primary Examiner* — Thinh T Nguyen
(74) *Attorney, Agent, or Firm* — Squire, Sanders & Dempsey (US) LLP

(57) ABSTRACT

A light emitting device, which can be efficiently manufactured and maintain a stable light emitting property for a long period, is provided. The light emitting device comprises a first resin forming body including a periphery that forms a recess to house a light emitting element and a bottom that forms a bottom portion of the recess, and a second resin forming body which covers the light emitting element. The first resin forming body is composed of a thermosetting epoxy resin composite whose essential component is an epoxy resin. The bottom covers surfaces of lead frames excluding mounting regions of the light emitting element and wires. A thickness of the bottom is formed thinner than a thickness from the surface of the lead frames to a leading end of the light emitting element.

15 Claims, 10 Drawing Sheets

FIG.4A
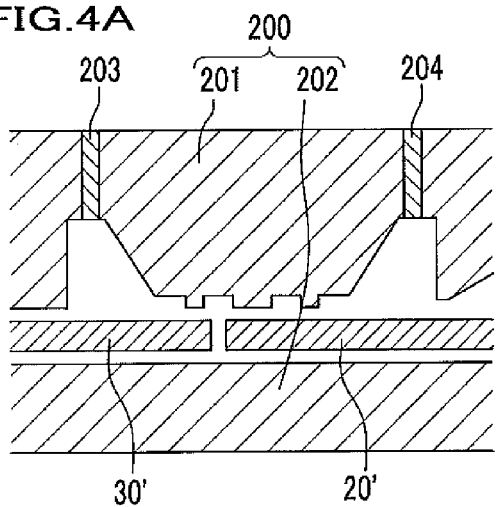
FIG.4B
FIG.4C
FIG.4D
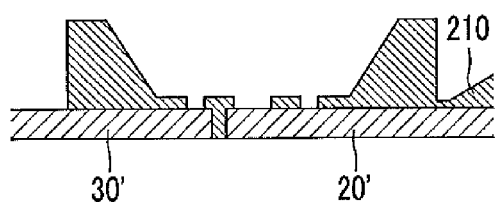
FIG.4E
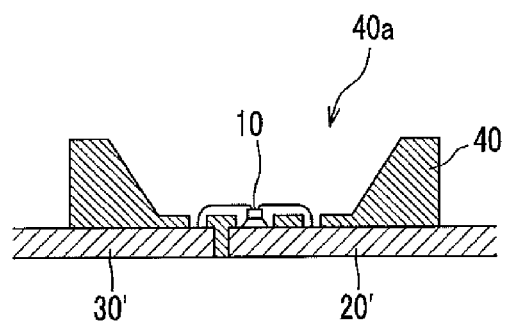
FIG.4F
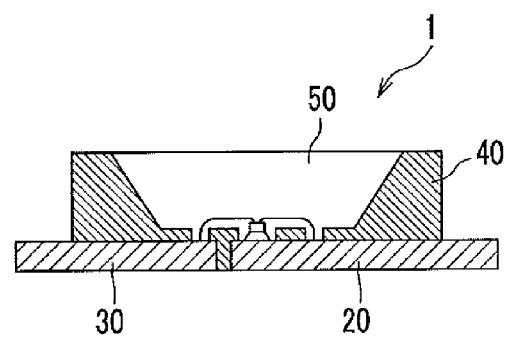

1G Light Emitting Device
97 V Groove
93 V Groove
40a Recess
95 V Groove
40c
10
40
30
20
40b
XI
XI
96 V Groove
98 V Groove
12
94 V Groove
60c 40a Recess
40c Bottom
40b Periphery } 40
50
40
30b
60b
60a
20b
30a
10
20a
30
11
20

LIGHT EMITTING DEVICE

CROSS REFERENCE TO RELATED APPLICATIONS

This application claims the foreign priority benefit under Title 35, United State Code, 119(a)-(d) of Japanese Patent Application No. 2006-353669, filed on Dec. 28, 2006 in the Japan Patent Office, the disclosure of which is herein incorporated by reference in its entirety.

BACKGROUND OF THE INVENTION

1. Field of the Invention

The present invention relates to alight emitting device and a method for manufacturing the light emitting device. Particularly, the present invention relates to a light emitting device having a high output power and reliability, which is used for an illumination apparatus, a backlight, a light emitting apparatus mounted on a vehicle, a display, an auxiliary light source for moving image illumination, and other general industrial and consumer light sources, and a method for manufacturing the light emitting device.

2. Description of Related Art

A light emitting device using a light emitting element such as a light emitting diode (LED) and a laser diode (LD), and a method for manufacturing the light emitting device have been developed recently. For example, such light emitting elements and manufacturing methods are disclosed in Japanese Laid-Open Patent Nos. 2001-177160, 2005-294736, H11-45958, and 2002-520823. FIGS. 12A and 12B show diagrams which indicate a construction of a conventional light emitting device. FIG. 12A is a schematic plan view of a conventional light emitting device observed from a main light emitting surface side, and FIG. 12B is an XII-XII cross-sectional view of FIG. 12A. A conventional light emitting device 301, as shown in FIGS. 12A and 12B, includes a light emitting element 310, lead frames 320 and 330, a casing (package) 340 that is a resin forming body to cover almost parts of the respective lead frames 320 and 330, and a covering member (sealing member) 350 that is a resin forming body covering the light emitting element 310. The casing 340 is composed of a thermoplastic resin based composite material and has a recess in the center of the casing 340. From a bottom of the recess, an inner lead 320a which is a part of a main surface side of the lead frame 330, is exposed, and the light emitting element 310 is mounted on the exposed part. The inner lead 320a is connected to the light emitting element 310 through a wire (conducting wire) 360a. Further, from the bottom of the recess of the casing 340, an inner lead 330a which is a part of the main surface side of the lead frame 330, is exposed, and the inner lead 330a is connected to the light emitting element 310 through a wire (conducting wire) 360b. The covering member 350 is composed of a good translucent member such as a thermosetting type silicon resin. The light emitting device 301 has a structure as mentioned below in order to efficiently reflect light radiated by the light emitting element 310. That is, the inner leads 320a and 330a are constructed so that an area of the main surface side is as large as possible, and a side surface inside the recess of the casing 340 is constructed to have a conical shape so that the side surface has an inclination widening upward.

A technology described in Japanese Laid-Open Patent No. 2001-177160 is directed to an object to prevent lifting of the lead frames 320 and 330 which is caused by a thermal expansion of the covering 550 in a reflow process. A thermoplastic resin based composite material such as nylon that is generally used for a material of the casing 340 of the light emitting element 310 becomes soft when it is heated. Hereby, a problem that the lead frames 320 and 330 lift is caused. On the contrary, if a thermosetting resin based composite material such as an epoxy resin is used for a material of the casing 340, the lead frames 340 and 340 hardly lift since a thermal expansion coefficient of the covering member 350 is close to that of the casing 340. Herein, Japanese Laid-Open Patent Nos. 2005-294736 and H11-45958 disclose general manufacturing methods for the conventional light emitting device 301. Further, Japanese Laid-Open Patent No. 2002-520823 discloses a technology that the inner leads 320a and 330a are covered at the bottom surface of the recess of the casing 340 excluding regions needed to electrically connect the light emitting element 310 by using a thermoplastic resin such as polycarbonate, and the bottom surface and the side wall of the recess function as a reflector.

In general, fluidity of the thermoplastic resin based composite material is inferior to that of the thermosetting resin based composite material. Therefore, it is difficult to form a molding in a thin shape for the thermoplastic resin based composite material. When one wants to obtain a molding by using the thermoplastic resin based composite material and achieving a high fluidity needed for molding, it is necessary to increase a molding temperature and a mold temperature to high. However, in this case, it is impossible to obtain a sufficient strength of the molding needed for releasing in an injection molding process. Hereby, there is a case that chipping of the molding occurs when the molding is taken out from molds. Further, if the molding temperature and the mold temperature are high, there is a case that a resin becomes deteriorating due to the high temperature and a color of the molding changes. Meanwhile, by reducing a filling amount of a filling agent (filler) in the thermoplastic resin composite material, it may be possible to achieve a high fluidity needed for a molding process. However, if a filling amount of filler in the light emitting device is reduced in the same way, for example, a reflection rate of the resin is decreased due to a decrease in an amount of a reflection substance, resulting in a significant reduction of performance of the light emitting device. On the other hand, it is possible to fill a filling agent at a high concentration for a thermosetting resin based composite material. Additionally, the thermosetting resin based composite material has a high fluidity comparing to the thermoplastic resin based composite material. For this reason as mentioned above, it is proposed to use a thermosetting resin based composite material for a material of the casing 340 of the light emitting element 310, in the light emitting device 301. However, in a case when the light emitting device 301 is manufactured by using a thermoplastic resin based composite material, a manufacturing process thereof is simpler and a manufacturing cost is lower than a case when a thermosetting resin based composite material is used. For the above mentioned reason, a casing 340 produced by using a thermosetting resin based composite material has not been realized to date. Herein, in a view point of adhesiveness between the casing 340 and the covering member 350, a thermosetting resin based composite material may be more preferable for a casing 340 material than a thermoplastic resin based composite material. Further, in a view point of adhesiveness between the casing 340 and the lead frames 320 and 330, a thermosetting resin based composite material may be more preferable for a casing 340 material than a thermoplastic resin based composite material.

The light emitting element 301 is free from burnout because the light emitting element is a semiconductor element, having excellent initial drive performance, strength in vibration, and excellent durability for repeated ON/OFF operations. Owing to such excellent properties, the light emitting device is utilized for illumination outside. Meanwhile, in a long period usage, oxygen or sulfide comes from outside air into the covering 350 of the light emitting element 310, and changes the surfaces of the inner leads 320a and 330a of the respective lead frames 320 and 330. Further, light and heat generated by light emission of the light emitting element 310 also change the color of the surfaces of the inner leads 320a and 330a. If the surfaces of the inner leads 320a and 330a are plated, the color of the plating film changes to black. Accordingly, a reflection rate of the inner leads 320a and 330a surrounding the light emitting element 310 is decreased, which leads to a decrease in output power of the light emitting device 301 (namely, becoming dark). Due to the above mentioned reasons, methods for elongating the life of the light emitting device 301 are proposed, in which the inner leads 320a and 330a surrounding the light emitting element are coated by a resin or an inorganic material. However, according to the above mentioned methods, a coating process for the inner leads 320a and 330a surrounding the light emitting element 310 is newly and additionally needed in a manufacturing process of the light emitting device 301. Moreover, since a coated part of the inner leads 320a and 330a plays as an insulating film, the light emitting element 310 is not electrically connected to the inner leads when it is mounted after the coating process. Therefore, a time-consuming process is needed, that is, a process that a part of the coating region is needed to be peeled off after coating all of the surfaces of the inner leads 320a and 330a, or a process that only predetermined regions of the inner leads 320a and 330a are beforehand coated, is needed. This causes a problem of reducing a productivity because the manufacturing process becomes more complicated.

The present invention has been developed to solve the above mentioned problems. Therefore, it is an object of the present invention to provide a light emitting device that is capable of maintaining a stable light emitting property for a long period. Further, it is another object of the present invention to provide a manufacturing method to efficiently produce a light emitting device that is capable of maintaining a stable light emitting property for a long period.

SUMMARY OF THE INVENTION

A light emitting device of the present invention comprises: a light emitting element; a first and second lead frames electrically connected to the light emitting element; a first resin forming body including a periphery which forms a recess for housing the light emitting element on the first and the second lead frames, and a bottom which forms a bottom portion of the recess; and a second resin forming body which covers the light emitting element housed in the recess of the first resin forming body. Herein, the first resin forming body is composed of a thermosetting epoxy resin composite of which essential component is an epoxy resin. The bottom covers surfaces of the first and the second lead frames excluding a mounting region of the light emitting element and mounting regions of wires. A thickness of the bottom is thinner than a thickness from a surface of the first and the second lead frames to a leading end of the light emitting element. Here, an edge portion of the covering part may have an R shaped form, or a taper form, so as to improve an extraction efficiency of light from the light emitting element.

According to the construction as mentioned above, since the bottom of the first resin forming body covers the first and the second lead frames excluding a mounting region of the light emitting element and mounting regions of the wires, upper surfaces of the first and the second lead frames excluding the mounting region of the light emitting element and the regions of the wires are protected by the bottom of the first resin forming body. As a result, the light emitting device can maintain a stable light emitting property for a long period. Here, the mounting region of the light emitting element is a region and a periphery of the region in which a connecting member for fixing the light emitting element on the first or the second lead frame contacts to the first or the second lead frame, or a region and a periphery of the region corresponding to the bottom surface of the light emitting element. The mounting regions of wires are regions and a periphery of the regions in which a connecting member for fixing the wires connected to the electrode of the light emitting element on the first or the second lead frame, contacts to the first or the second lead frame. Here, it is preferable that an area of the periphery is a sufficient area so that a protective element of the light emitting element can be placed.

Further, according to the light emitting device of the present invention, since the first resin forming body is composed of a thermosetting epoxy resin composite of which essential component is an epoxy resin, a thermal fluidity of the first resin forming body in a molding process is superior to that of a first resin forming body composed of a composite material including a thermoplastic resin. Accordingly, it is easy to process a thin shaped molding, and to have a thickness of the bottom of the first resin forming body thinner than a thickness from the surface of the first and the second lead frames and a leading end of the light emitting element. Further, in the light emitting device, since a thickness of the bottom of the first resin forming body is thinner than a thickness from the surface of the first and the second lead frames and a leading end of the light emitting element, light radiated from the light emitting surfaces excluding the upper surface (main light emitting surface) of the light emitting element, that is, from the side surfaces, can not be disturbed and reach the periphery of the first resin forming body. Therefore, since the light radiated from the side surfaces reaches the periphery of the first resin forming body is reflected on the circumferential surface of the periphery, it is possible to efficiently radiate the light of the light emitting element to the outside from the upper surface (opening) of the recess. As a result, a light emitting device having a high output power can be realized. Here, it is preferable that the periphery of the first resin forming body has an inclination widening toward the upper surface (opening) of the recess.

Here, it is preferable that the first resin forming body is composed of a thermosetting epoxy resin composite of which essential component is an epoxy resin that includes a triazine derivative epoxy resin, and that the second resin forming body is composed of the same material as the first resin forming body or a silicon contained resin.

According to the construction of the light emitting device as mentioned above, since the second resin forming body is composed of the same material as the first resin forming body or a silicon contained resin, and the first resin forming body includes a lot of functional groups, the first resin forming body has a good adhesiveness property, even if a thermo expansion coefficient of the second resin forming body filled in the recess of the first resin forming body is equal to or larger than a thermo expansion coefficient of the first resin forming body. Due to the above mentioned reasons, the second resin forming body does not peel off the bottom and periphery of the first resin forming body at the interface. As a result, a light emitting device excellent in heat-resistance, light-resistance, and adhesiveness can be provided. Further, the adhesiveness between the first resin forming body and the second resin forming body is excellent, an exfoliation of the first and the second lead frames is prevented.

Further, it is preferable that the first resin forming body includes a peripheral side surface on the bottom, which surrounds a circumference of the light emitting element, and that the peripheral side surface has a predetermined inclination so that a circumference of the upper side surface of the bottom is longer than a circumference of the bottom side surface of the bottom.

According to the above-mentioned construction of the light emitting device, a peripheral side surface surrounding a circumference of the light emitting element has a predetermined inclination so that a circumference of the upper side surface of the bottom is longer than a circumference of the bottom side surface of the bottom, at the bottom of the first resin forming body. Therefore, the peripheral side surface having the inclination so that the circumference of the upper surface side of the bottom is longer than the circumference of the bottom surface side of the bottom, can more efficiently reflect the light radiated from the side surfaces of the light emitting element in a direction from the upper surface (opening) of the recess to the outside and a direction toward the periphery of the first resin forming body, than a peripheral side surface which is provided vertically to the bottom surface. Therefore, the light of the light emitting element can be efficiently radiated.

Herein, it is preferable that the bottom and the periphery of the first resin forming body are integratedly formed. Alternatively, it is also preferable that the bottom and the periphery of the first resin forming body are separately formed.

According to the above-mentioned construction, when the bottom and the periphery of the first resin forming body are integratedly formed, it is possible to tightly bond the bottom to the periphery at the interface. Alternatively, when the bottom and the periphery of the first resin forming body are separately formed, it is possible to easily change a design of a thickness of the bottom and an area of the exposed part.

Further, it is preferable that an anchor hole or a groove is provided with the first and the second lead frames, and that the first resin forming body is filled in the anchor hole or the groove.

According to the above-mentioned construction of the light emitting device, since an adhesiveness between the first and the second lead frames and the first resin forming body which is provided with the first and the second lead frames can be improved, it is possible to prevent the first resin forming body from peeling off the first and the second lead frames on which the first resin forming body is arranged. By preventing the peeling, it is possible to inhibit a color change of a plated film caused by intrusion of outer air and moisture, and a decrease in a light extraction efficiency caused by a light absorption on the peeled surface. As a result, a reliability of the light emitting device can be maintained for a long period.

A manufacturing method of a light emitting device of the present invention is a method to produce a light emitting device, which includes a light emitting element, first and second lead frames electrically connected to the light emitting device, a first resin forming body having a periphery which forms a recess for housing the light emitting element on the first and the second lead frames and a bottom which forms a bottom portion of the recess, and a second resin forming body which covers the light emitting element housed in the recess of the first resin forming body. Here, a thickness of the bottom is formed thinner than a thickness from a surface of the first and the second lead frames to a leading end of the light emitting element. The manufacturing method of the light emitting device comprises:

a first step in which the first lead frame and the second lead frame are pinched by an upper mold on which the same shaped spaces as the periphery and the bottom of the first resin forming body are beforehand formed, and a lower mold which corresponds to the upper mold, with having a space between the first and the second lead frames;

a second step in which a first thermosetting resin is injected into a space pinched by the upper mold and the lower mold to fill the space formed on the upper mold;

a third step in which the first resin forming body is integratedly formed with the first and the second lead frames by the first thermosetting resin which is filled in the space formed on the upper mold;

a fourth step in which the light emitting element is housed in the recess of the first resin forming body, the recess being formed corresponding to the space formed on the upper mold, and is electrically connected to the first and the second lead frames; and a fifth step in which a second thermosetting resin is injected into the recess of the first resin forming body to cover the light emitting element housed in the recess, and the second resin forming body is formed.

According to the above-mentioned steps of the manufacturing method of the light emitting device, an upper mold on which the same shaped spaces as the recess, the periphery, and the bottom of the first resin forming body are beforehand formed, and a lower mold that corresponds to the upper mold, are used in the steps. Accordingly, a thick shaped periphery that works as a casing of the light emitting device and a thin shaped bottom that forms a bottom of the recess of the first resin forming body, can be produced at the same time. Therefore, a step that is needed for a conventional light emitting device is not needed. That is, a step for coating a protection resin on a surface of the lead frame after the casing is prepared and before the light emitting element is mounted, is not needed. As a result, it is possible to produce a light emitting device in a highly productive manner, which has a stable light emitting property for a long period.

According to the present invention, it is possible to provide a light emitting device that can maintain a stable light emitting property for a long period. Further, it is possible to efficiently produce a light emitting device that can maintain a stable light emitting property for a long period.

BRIEF DESCRIPTION OF THE DRAWINGS

FIG. 1A is a plan view of the light emitting device observed from a main light emitting surface side. FIG. 1B is a I-I line cross-sectional diagram of FIG. 1A.

FIGS. 4A to 4F are cross-sectional diagrams schematically showing a process for manufacturing the light emitting device in FIGS. 1A and 1B.

FIG. 7A is a plan view of the light emitting device observed from a main light emitting surface side. FIG. 7B is a VII-VII line cross-sectional diagram of FIG. 7A.

FIG. 8A is a plan view of the light emitting device observed from a main light emitting surface side. FIG. 8B is a VIII-VIII line cross-sectional diagram of FIG. 8A.

FIG. 9A is a plan view of the light emitting device observed from a main light emitting surface side. FIG. 9B is a IV-IV line cross-sectional diagram of FIG. 9A.

FIG. 10A is a plan view of the light emitting device observed from a main light emitting surface side. FIG. 10B is a X-X line cross-sectional diagram of FIG. 10A.

FIG. 11A is a plan view of the light emitting device observed from a main light emitting surface. FIG. 11B is a XI-XI line cross-sectional diagram of FIG. 11A.

FIG. 12A is a plan view of the light emitting device observed from a main light emitting surface side. FIG. 12B is a XII-XII line cross-sectional diagram of FIG. 12A.

DETAILED DESCRIPTION OF THE PREFERRED EMBODIMENT

Now, preferred embodiments (hereinafter, referred to embodiments) of the light emitting device and the method for manufacturing the same of the present invention will be described in detail below with reference to the accompanying drawings. However, the present invention is not limited to such embodiments.

First Embodiment

[Construction of Light Emitting Device]

Figure 1A:
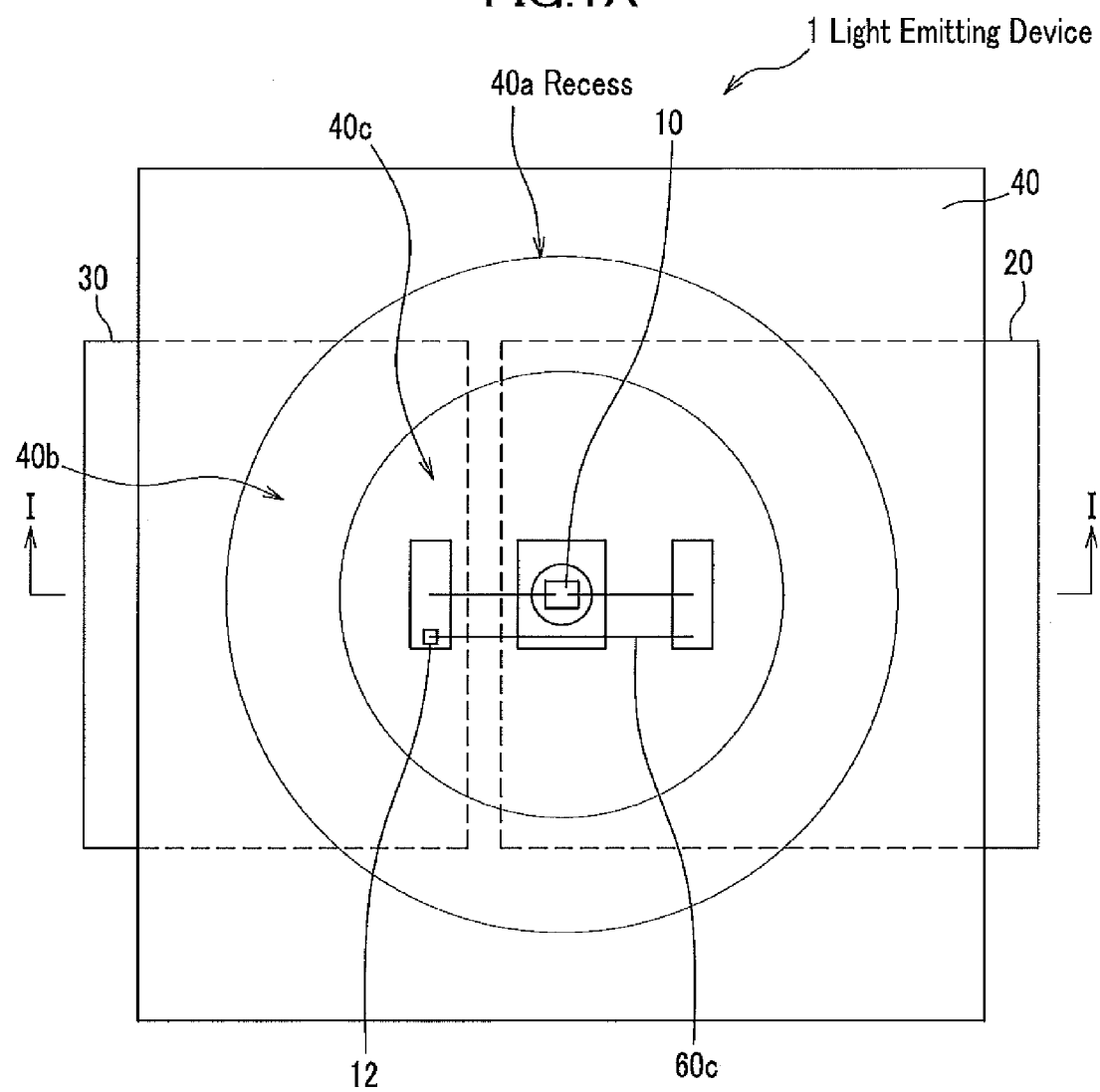
FIGS. 1A and 1B are schematic diagrams showing a construction of the light emitting device of the first embodiment of the present invention.
Figure 1B:
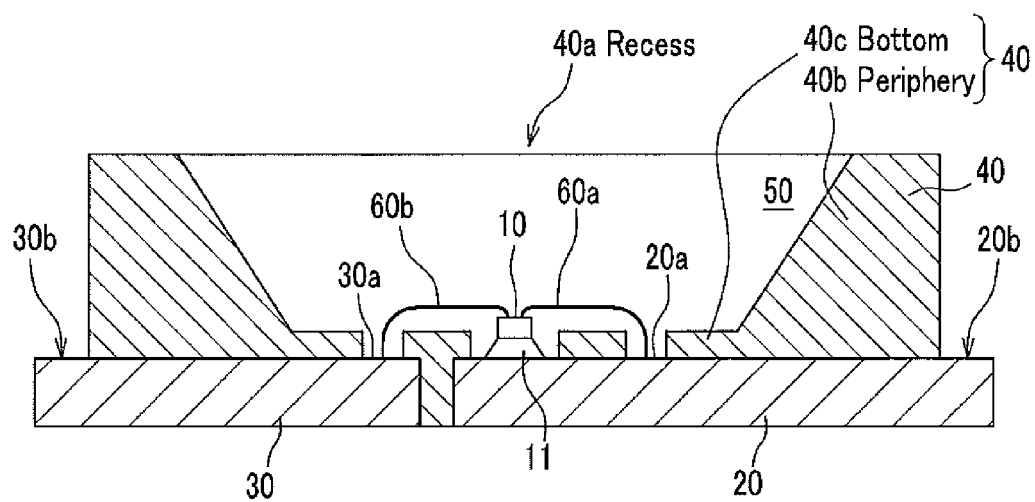
Figure 2:
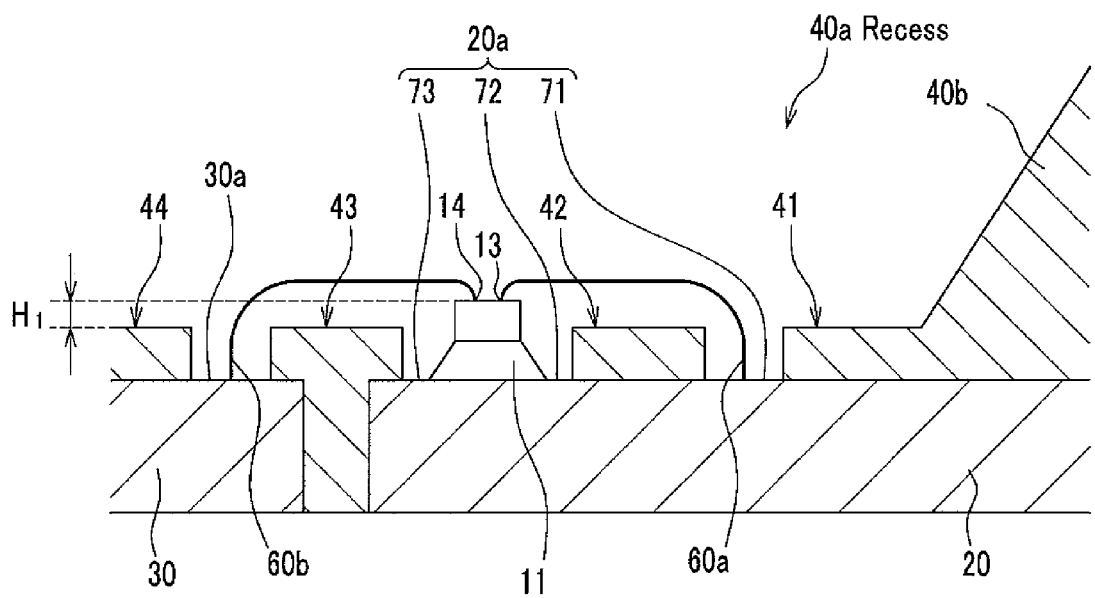
FIG. 2 is a magnified cross-sectional diagram of a portion of FIG. 1B.

FIGS. 1A and 1B are schematic diagrams showing a construction of the light emitting device of the first embodiment of the present invention. FIG. 1A is a plan view of the light emitting diagram observed from a main light emitting surface side. FIG. 1B is a I-I line cross-sectional diagram of FIG. 1A. FIG. 2 is a magnified cross sectional diagram of a portion of FIG. 1B, in the light emitting device.

A light emitting device 1 of the first embodiment comprises, a light emitting element 10, a first lead frame 20, a second lead frame 30, a first resin forming body 40, and a second resin forming body 50. In the light emitting device of the present invention, a surface side on which the light emitting element 10 is mounted is called a main surface side, and the opposite side is named rear surface side. The first and the second lead frames 20 and 30 are electrically connected to the light emitting element 10. The first resin forming body 40 includes a periphery 40b forming a recess 40a which houses the light emitting element 10 on the first and the second lead frames 20 and 30, and a bottom 40c forming a bottom part of the recess 40a. The second resin forming body 50 covers the light emitting element 10 housed in the recess 40a of the first resin forming body 40. The first resin forming body 40 is composed of a thermosetting epoxy resin composite of which essential component is an epoxy resin. On a bottom surface side of the second resin forming body 50, the first resin forming body 40 covers surfaces of the first and the second lead frames 20 and 30 excluding mounting regions of the light emitting element 10 and wires 60a and 60b. Further, at the bottom surface of the second resin forming body 50, a thickness of the bottom 40c is thinner than a thickness from the surface of the first and the second lead frames 20 and 30 to a leading end of the light emitting element 10. Next, each construction member will be described below in detail.

<Light Emitting Element>

The light emitting element 10 includes, for example, an LED which is composed of a nitrogen gallium based compound semiconductor. The light emitting element 10 is arranged on the first lead frame 20 through a die-bonded resin (connecting member). The die-bonded resin is composed of, for example, an epoxy resin including silver.

According to this embodiment, a protective element 12 is provided to protect the light emitting element 10. The protecting element 12 is composed of a Zener-diode, and arranged on the second lead frame 30 as shown in FIG. 1A. Alternatively, the protective element 12 may be arranged on the first lead frame 20.

Further, the light emitting element 10 includes a pair of electrodes such as a first electrode 13 (cathode) and a second electrode 14 (anode). According to the embodiment, the first electrode (cathode) 13 and the second electrode (anode) 14 are formed on the same (upper) surface.

<First Lead Flame and Second Lead Frame>

The first lead frame ((−) electrode) 20 and the second lead frame ((+) electrode) 30 are a pair of positive and negative electrodes. The first lead frame 30 and the second lead frame 30 connect the light emitting element 10 to an outside electrode not shown and are composed of a good electrically conductive metallic member such as iron, phosphor bronze, and copper alloy. As shown in FIG. 1B, a part of an upper surface (hereinafter, referred to a main surface) and a rear surface of the first lead frame 20 and the second lead frame 30 are exposed from the first resin forming body 40. The main surfaces of the first lead frame 20 and the second lead frame 30 are formed as flat to efficiently reflect light emitted from the light emitting element 10. Metallic plating which uses silver, aluminum, copper, and gold, or alloy plating which uses a different kind of metals is performed on mounting surfaces of the first lead frame 20 and the second lead frame 30, on which the light emitting element 10 is mounted, in order to efficiently reflect light radiated from the light emitting element 10. As shown in a plan view of FIG. 1A, the light emitting device 1 is constructed so that a ratio of the surface region of the first lead flame 20 and the second lead frame 30 to the surface region of the first resin forming body 40 is comparatively large. Hereby, when radiation of heat is increased, it is possible to efficiently prevent the light emitting element 10 from rising in temperature. Thus, it is possible to pass a relatively large amount of an electric current through the light emitting device 10.

<First Lead Frame>

The first lead frame 20 includes a first inner lead 20a and a first outer lead 20b, as portions which are exposed from the first resin forming body 40. According to the embodiment, as shown in FIG. 2, the first inner lead 20a comprises amounting region 71 which includes a peripheral region of a connecting point of a wire 60a electrically connected to the first electrode 13 of the light emitting element 10, and mounting regions 72 and 73 of the light emitting element 10 which include peripheral regions of the die-bonded resin 11 binding the light emitting element 10. Here, the mounting regions 72 and 73 of the light emitting element 10 shown in FIG. 2, region continuous region which surrounds the light emitting element 10 as shown in a plan view of FIG. 1A. For convenience of an explanation, the mounting regions 72 and 73 are differently numbered, although they are a continuous region as shown in FIG. 1A. As shown in FIG. 1B, The outer lead 20b is electrically connected to an external electrode (cathode) not shown. Here, the outer lead 20b represents not only a protruding part from a right side of the first resin forming body 40 but an exposed part at a rear surface side of the first resin forming body 40. Therefore, the outer lead 20b can be electrically connected to the external electrode (cathode) not shown by a lead-free solder alloy at the rear surface side.

<Second Lead Frame>

The second lead frame 30 includes a second inner lead 30a and a second outer lead 30b as exposed parts exposed from the first resin forming body 40. As shown in FIG. 1B, a gap with a predetermined distance is provided between the second inner lead 30a and the first inner lead 20a of the first lead frame 20. The second inner lead 30a is electrically connected through a wire 60b to the second electrode 14 of the light emitting element 10. In the embodiment, the protective element 12 is mounted on the second inner lead 30a, as shown in FIG. 1A. Herein, if the protective element 12 is not mounted, the inner lead 30b may have only an area (area of a wire-bonding region) needed for bonding the wire 60b.

The second outer lead 30b is electrically connected to an external electrode (anode). Here, the outer lead 30b represents not only a protruding part from a left side of the first resin forming body 40 but an exposed part at the rear surface side of the first resin forming body 40. Therefore, the outer lead 30b can be electrically connected to an external electrode (anode) not shown, by a lead-free solder alloy at the rear surface side. The second outer lead 30b and the first outer lead 20b together form virtually the same plane at the rear surface side. Hereby, it is possible to improve a mounting stability of the light emitting device 1. The second outer lead 30b and the first outer lead 20b may be mounted on the external electrode and electrically connected to the external electrode not shown.

<First Resin Forming Body>

(Structure of First Resin Forming Body)

The first resin forming body 40 is composed of a thermo setting resin and integrally formed with the first lead frame 20 and the second lead frame 30 by a transfer-molding process.

As shown in FIG. 1B, the first resin forming body 40 comprises a periphery 40b which forms a recess 40a for housing the light emitting element 10, and a bottom 40c which forms a bottom part of the recess 40a, on the first lead frame 20 and the second lead frame 30. In the present embodiment, an inner circumferential surface of the periphery 40b is formed as having an inclination widening toward an opening of the recess 40a. In other words, an upper surface (opening) of the recess 40a is wider than a bottom surface of the recess 40a, as shown in FIG. 1A. Hereby, light radiated from the light emitting element 10 in an upper direction (front direction) can be efficiently extracted. As shown in FIG. 1B, an inclination angle between an upper surface of the bottom 40c and an inner circumferential surface of the periphery 40b, is preferably from 95° to 150°, more preferably, from 100° to 120°. Preferably, the inner circumferential surface of the periphery 40b is flat, or may have indentations. When such the indentations are provided, it is possible to improve adhesiveness of an interface between the first resin forming body 40 and the second resin forming body 50.

As shown in FIG. 2, the bottom 40c of the first resin forming body 40 covers surfaces of the first and the second lead frames 20 and 30 excluding mounting regions 72 and 73 of the light emitting element 10, a mounting region 71 of the wire 60a, and a mounting region (second inner lead 30a) of the wire 60b. In a magnified cross-sectional diagram shown in FIG. 2, the bottom 40c is named coverings 41, 42, 43, and 44 for the sake of convenience. As shown in FIG. 1a, theses coverings 41, 42, 43, and 44 represent a continuous region that surrounds the first inner lead 20a and the second inner lead 30a, and are numbered differently for convenience of the explanation. As shown in FIG. 2A, a thickness of the bottom 40c, that is, a thickness of the coverings 41, 42, 43, and 44, is thinner by H1 than a thickness from the surface of the first and the second lead frames 20 and 30 to the leading end (upper surface) of the light emitting element 10. Further, in the present embodiment, it is possible to prevent the die-bonded resin 11 flowing into the connecting portion of the wire 60b because the mounting regions 72 and 73 of the light emitting element 10 are separated from the mounting region 71 of the wire 60a. Furthermore, the protective element 12 is arranged on the mounting region (second inner lead 30a) of the wire 60b, as shown in FIG. 1A.

Figure 3:
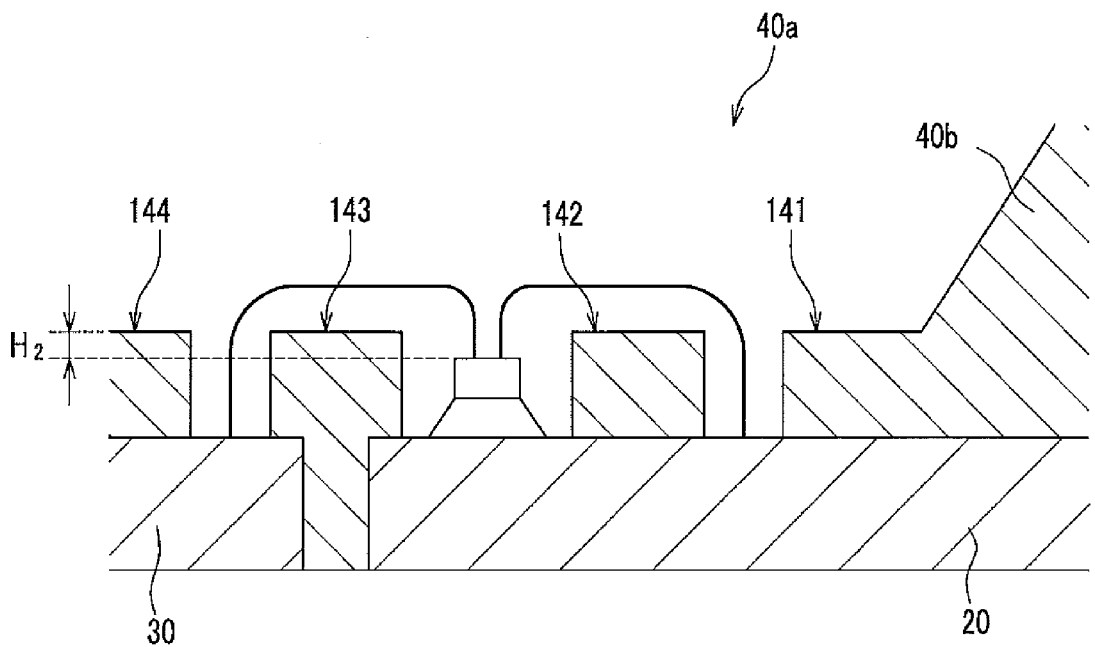
FIG. 3 is a cross-sectional diagram schematically showing a comparison example diagram which corresponds to the cross-sectional diagram of FIG. 2.

Next, an effect that is caused by a structure that the bottom 40c (comprising coverings 41, 42, 43, and 44) of the first resin forming body 40 is formed thin will be explained with reference to FIG. 3 and FIG. 2. FIG. 3 is a cross-sectional diagram schematically showing a comparison example which corresponds to a cross-sectional diagram of FIG. 2. As shown in FIG. 3, in the comparison example, a thickness of the respective coverings 141, 142, 143, and 144 is thicker by a height H2 than a thickness from the surface of the first and the second lead frames 20 and 30 to the leading end of the light emitting element 10. In this comparison example, light radiated in a horizontal direction from light emitting surfaces excluding an upper surface (main light emission surface) of the light emitting element 10, that is, side surfaces, is reflected on side surfaces of the coverings 142 and 143. As a result, the reflected light can not be radiated to the upper surface (opening) of the recess 40a. On the other hand, in case of the light emitting device 1 of the present embodiment, as shown in FIG. 2, light radiated in a horizontal direction from the side surfaces of the light emitting element 10, passes over the coverings 41, 42, 43, and 44, and reaches an inner circumferential surface of the periphery 40b of the first resin forming body 40. Therefore, the light reflected on the inner circumferential surface of the periphery 40b can be efficiently radiated to the outside from the upper surface (opening) of the recess 40a.

(Material of First Resin Forming Body)

According to the present embodiment, the first resin forming body 40 is composed of a thermosetting resin based composite material (hereinafter, referred to first thermosetting resin). For example, a thermosetting epoxy resin composite is used in the embodiment, of which essential component is an epoxy resin including a triazine derivative epoxy resin. Particularly, the epoxy resin including the triazine derivative epoxy resin and the thermosetting epoxy resin made of a hydrogenated cycloalkyl acid anhydride, are more preferable because of their excellent heat-resistance and photo-resistance properties. The first thermosetting resin includes an acid anhydride, an anti-oxidant, a mold releasing agent, a light reflector, an inorganic filler, a curing catalyst, and a photo-stabilizer in addition to an epoxy resin having a triazine derivative epoxy resin. Here, if titanium dioxide is used as a light reflector, preferably, titanium dioxide is filled in the epoxy resin in 10 to 60 wt %.

<Second Resin Forming Body>

The second resin forming body 50 covers the light emitting element 10 placed in the recess 40*a* of the first resin forming body 40. The second resin forming body 50 is provided to protect the light emitting element 10 from an external force, dust and water as well as to increase a heat resistance, a weather-resistance, and a photo-resistance of the light emitting element 10. Additionally, the second resin forming body 50 is provided to efficiently radiate the light of the light emitting element 10 to the outside. In the present embodiment, as shown in FIG. 1B, an upper surface of the second resin forming body 50 is identical with an upper surface of the recess 40*a* of the first resin forming body 40.

The second resin forming body 50 is composed of the same material as the first resin forming body 40 or a silicon containing resin. Therefore, a physical property of the second resin forming body 50 such as a thermal expansion coefficient is the same as that of the first resin forming body 40. With respect to a thermal expansion coefficient, a coefficient value of the second resin forming body 50 may be larger than that of the first resin forming body 40. Since the first resin forming body 40 of the light emitting device includes many functional groups, peeling at the interface between the second resin forming body 50 and the first resin forming body 40 is suppressed, and the excellent heat-resistance, photo-resistance and adhesiveness properties are provided. Hereinafter, a material composing the second resin forming member 50 is referred to a second thermosetting resin.

Further, at least a material selected from a group including a fluorescent material, a diffusing agent, a dye, a pigment, and a reflector can be mixed in the second resin forming body 50 so as to provide a predetermined function. For example, by mixing a fluorescent material, it is possible to easily control color adjustment of the light emitting device 1. Herein, a fluorescent material, which has a larger specific gravity than the second thermosetting resin, absorbs light of the light emitting element 10, and converts a wavelength of the light, can be used for the second resin forming body 50. A fluorescent material having a larger specific gravity than the second thermosetting resin, is preferable, because the fluorescent material precipitates at a bottom surface side of the recess 40*a*. For a diffusing agent, such agents can be preferably used as barium titanate, titanium oxide, aluminum oxide, and silicon oxide. Further, for a dye and a pigment, an organic or inorganic coloring dye and a coloring pigment can be used to exclude light of an undesirable wavelength.

[Manufacturing Method of Light Emitting Device]

Next a method for manufacturing the light emitting device shown in FIGS. 1A and 1B will be explained with reference to FIGS. 4A to 4F (also FIGS. 1A, 1B and 2). FIGS. 4A to 4F are cross sectional diagrams schematically showing manufacturing steps of the light emitting device 1 shown in FIG. 1B. Here, a housing forming mold 200 includes an upper mold 201, a lower mold 202, and ejection pins 203 and 204. The same shaped spaces as the periphery 40*b* and the bottom 40*c* of the first resin forming body 40 are formed in a predetermined manner on the upper mold 201. Here, metallic plates whose surfaces are plated and on which the light emitting element is mounted before the first lead frame 20 and the second lead frame 30 of the light emitting device 1 shown in FIGS. 1A and 1B are formed by being cut in a predetermined length, are named a first lead frame 20' and a second lead frame 30'. Herein, upper surfaces of the first lead frame 20' and the second lead frame 30' are plated.

In the present embodiment, the following first, second and third steps are operated by a transfer-molding process. In the transfer-molding process, a pellet shaped first thermosetting resin (tablet) with a predetermined size is placed beforehand in a predetermined vessel connecting to the upper mold 201 and the lower mold 202.

<First Step>

In the first step, as shown in FIG. 4A, the first lead frame 20' and the second lead frame 30' are placed between the upper mold 201 and the lower mold 202 with having a space between the first and the second lead frames 20' and 30', and pinched as shown in FIG. 4B. For convenience of the explanation, FIG. 4A shows a state that lower surfaces of the first lead frame 20' and the second lead frame 30' are separated from the lower mold 202. In an actual process, the first lead frame 20' and the second lead frame 30' are fixed on the heated lower mold 202. In a pinching process shown in FIG. 4B, the upper mold 201 is also heated as the lower mold 202.

<Second Step>

Next, in the second step, the first thermosetting resin is injected into a space between the upper mold 201 and the lower mold 202 and a space formed on the upper mold 201 is fulfilled by the resin. Specifically, by adding a pressure by a piston to a predetermined vessel connecting to the upper mold 201 and the lower mold 202, a melted first thermosetting resin is injected into the space of the upper mold 201 through a material injection gate 205 shown in FIG. 4B from the predetermined vessel. Hereby, as shown in FIG. 4C, the space formed on the upper mold 201 is filled by the molten first thermosetting resin.

<Third Step>

In the third step, by using the first thermosetting resin filled in the space formed on the upper mold 201, the first resin forming body 40 is integratedly formed with the first and the second lead frames 20' and 30'. For example, firstly, the first thermosetting resin filled in the spaced formed on the upper mold 201 is heated. Then, the first resin forming body 40 is formed by the first thermosetting resin which is cured (temporarily) by the heating. If the curing is insufficient, the first thermosetting resin is further heated to increase a strength of the first resin forming body 40 at a predetermined temperature for a predetermined time, and the first resin forming body 40 becomes capable of being separated from the upper mold 201 (post curing).

After the first thermosetting resin is cured, the upper mold 201 is taken out by pushing a molding (housing) by eject pins 203 and 204, then the lower mold 202 is taken out from the first lead frame 20' and the second lead frame 30'. The molding taken out from the upper mold 201 and the lower mold 202 is shown in FIG. 4D. As shown in FIG. 4D, on the molding, a portion that becomes a casing of the light emitting element 10 is formed, and a resin coated part (covering) that covers surfaces of the first and the second lead frames 20' and 30' excluding an region for mounting the light emitting element 10 and regions for wire binding. Further, since a gate and a runner 210 are attached to the molding shown in FIG. 4D, the gate and the runner 210 are removed. Furthermore, burrs formed at an outer circumference of the forming body and burrs formed on the first lead frame 20' and the second lead frames 30', are also removed. Hereby, the first resin forming body 40 is formed. Then, portions of the first lead frame 20' and the second lead frame 30' corresponding to the first outer lead 20*b* and the second outer lead 30*b* are plated.

Here, when the gate and the runner 210 are removed, it is possible to use a tool (or mold) for removing the runner and a tool (or mold) for cutting the gate. Further, when burrs are removed, it is possible to perform a blast treatment after electrolysis treatment (chemical treatment) for the molding, the first lead frame 20' and the second lead frame 30'. Herein, for the blast treatment, it is possible to use a wet blast using a water jet or a dry blast using an abrasive.

<Forth Step>

In the forth step, as shown in FIG. 4E, the light emitting element 10 is mounted in the recess 40a of the first resin forming body 40, which is formed corresponding to a space formed on the upper mold 201, and the light emitting element 10 is electrically connected to the first and the second lead frames 20' and 30'. For example, the light emitting element 10 is mounted (die-bonded) by soldering on the first inner lead 20a that is a bottom of the recess 40a. The first electrode 13 of the light emitting element 10 is electrically connected to the first inner lead 20a through the wire 60a, and also the second electrode 14 of the light emitting element 10 is electrically connected to the second inner lead 30a through the wire 60b.

<Fifth Step>

In the fifth step, as shown in FIG. 4F, the second thermosetting resin is injected into the recess 40a of the first resin forming body 40 to cover the light emitting element 10 mounted in the recess 40a, and the second resin forming body 50 is formed. For example, by dropping the second thermosetting resin until the dropped resin reaches an upper surface of the recess 40a, the second thermosetting resin is filled in the recess 40a. Then, the second thermosetting resin filled in the recess 40a is cured by heating to form the second resin forming body 50. Next, the first and the second lead frames 20' and 30' are cut at predetermined positions to form the first and at the second lead frames 20 and 30. Here, it is possible to use a method for injecting, pressing and ejecting to fill the second thermosetting resin into the recess 40a of the first resin forming body 40. Herein, as a method to fill the recess 40a, a dropping method is preferable because the dropping method can efficiently remove air remained in the recess 40a.

According to the light emitting device 1 of the present embodiment, the light emitting device 1 can keep a stable emitting property for a long period because the first and the second lead frames 20 and 30 are covered by the bottom 40c (coverings 41 to 44) of the first resin forming body 40 excluding a mounting region of the light emitting element 10 and mounting regions of the wires 60a and 60b so that films plated on surfaces of the first and the second lead frames 20 and 30 are protected.

Further, according to the manufacturing method of the light emitting device of the present embodiment, the bottom 40c (coverings 41, 42, 43, and 44) with a thin thickness that forms a bottom portion of the recess 40a of the first resin forming body 40 and the periphery 40b with a thick thickness that forms the recess 40a are formed at the same time, by using the upper mold 201 on which the same shaped spaces as periphery 40b and the bottom 40c of the first resin forming body 40, and the lower mold 202 corresponding to the upper mold 201, are formed beforehand. Therefore, it is possible to produce a light emitting device more productively that can maintain a stable light emitting property for a longer period than a conventional light emitting device.

Second Embodiment

Figure 5:
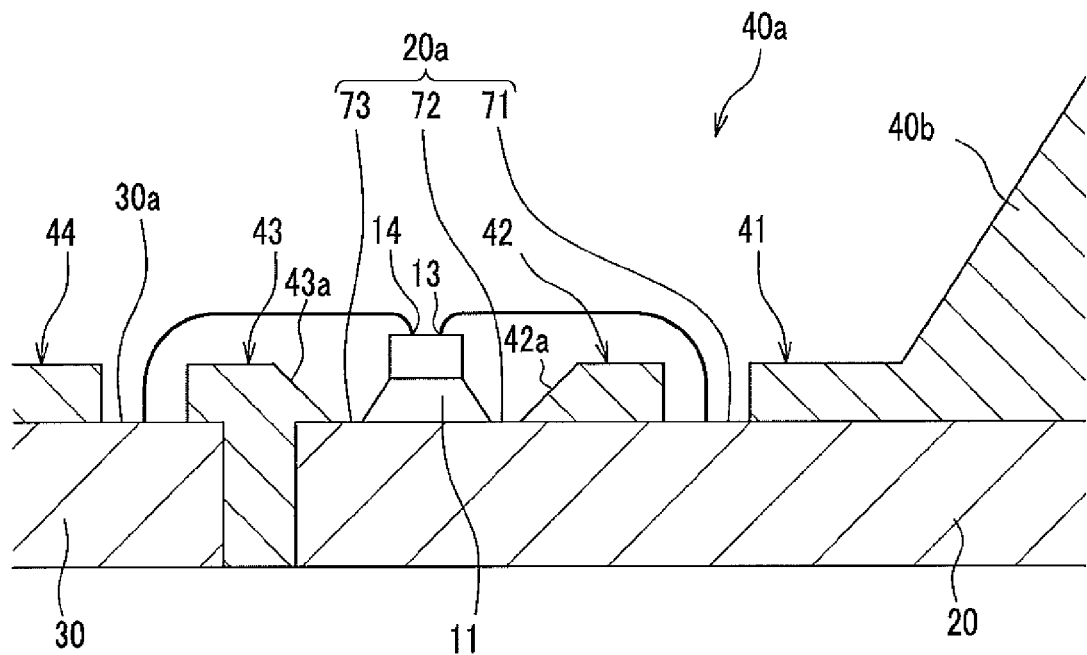
FIG. 5 is a cross sectional diagram schematically showing a construction of the light emitting device of the second embodiment of the present invention.

FIG. 5 is a cross-sectional diagram schematically showing a construction of the light emitting device of the second embodiment of the present invention. The light emitting device of the second embodiment has the same construction as the first embodiment except for a difference in a shape of the bottom 40c (coverings 41, 42, 43, and 44) of the first resin forming body 40. Thus, the same numbers are used in FIG. 5 as in FIG. 2 and additional explanations will be omitted. As shown in FIG. 5, a bottom 40c of the first resin forming body 40 comprises peripheral side surfaces 42a and 43a which surround a circumference of the light emitting element 10. The peripheral side surfaces 42a and 43a are arranged to have predetermined inclinations so that a circumference of the upper surface of the bottom 40c (coverings 41, 42, 43, and 44) is longer than a circumference of the bottom surface of the bottom 40c (coverings 41, 42, 43, and 44). On the other hand, peripheral side surfaces of the first embodiment (left side surface of the covering 42 and the right side surface of the covering 43), as explained with reference to FIG. 2, are arranged vertically to the bottom surface.

Therefore, according to the second embodiment, the peripheral side surfaces 42a and 42b shown in FIG. 5 can more easily reflect light radiated from side surfaces of the light emitting element in a direction from an upper surface (opening) of the recess 40a to the outside, and in a direction to an inner circumference of the periphery 40b of the first resin forming body 40, than the peripheral side surfaces shown in FIG. 2. Accordingly, the light of the light emitting element can be more efficiently reflected.

Second Embodiment

Figure 6:
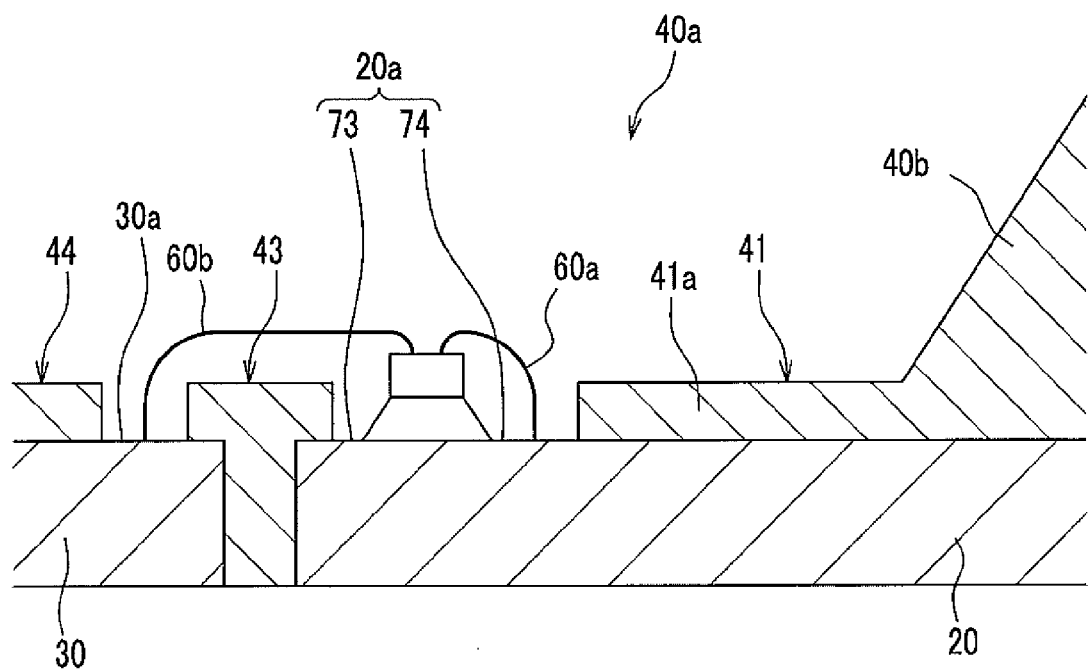
FIG. 6 is a cross sectional diagram schematically showing a construction of the light emitting device of the third embodiment of the present invention.

FIG. 6 is a cross-sectional diagram schematically showing a construction of the light emitting device of the third embodiment of the present invention. The light emitting device of the third embodiment has the same construction as the first embodiment except for a difference in a shape of the bottom 40c of the first resin forming body 40. Thus, the same numbers are used in FIG. 6 as in FIG. 2 and additional explanations will be omitted. As shown in FIG. 6, a bottom 40c (coverings 41, 43, and 44) of a first resin forming body 40 of the third embodiment, covers surfaces of first and second lead frames 20 and 30 except for mounting regions 73 and 74 of the light emitting element 10, and a mounting region of a wire 60a and a mounting region of a wire 60b (second inner lead 30a), and an extended part 41a is formed with the covering 41. That is, at the bottom 40c (coverings 41, 43, and 44) of the first resin forming body 40 shown in FIG. 6, a mounting region 71 for the wire 60a that is shown in the first embodiment with reference to FIG. 2 is not formed. A mounting region 74 of the wire 60a as shown in FIG. 6, is common with a mounting region 74 of the light emitting element 10. In other words, a first inner lead 20a of the first lead frame 20 is provided at only one region. On the contrary, in the first embodiment, the first inner lead 20a is provided separately at two regions as shown in FIGS. 1A, 1B and 2.

Therefore, according to the third embodiment, it is possible to decrease an area of the first inner lead 20a smaller than the area of the first embodiment. That is, in the third embodiment, it is possible to extend the bottom 40c (coverings) of the first resin forming body 40 larger than the bottom 40c of the first embodiment. As a result, since films formed on surfaces of the first and the second lead frames 20 and 30 are efficiently protected, it is possible to realize a high performance light emitting device having a stable and high output power for a long period. Further, in the third embodiment, it is possible to simplify a shape of molds to form the first resin forming body 40 in comparison to the first embodiment.

Forth Embodiment

Figure 7A:
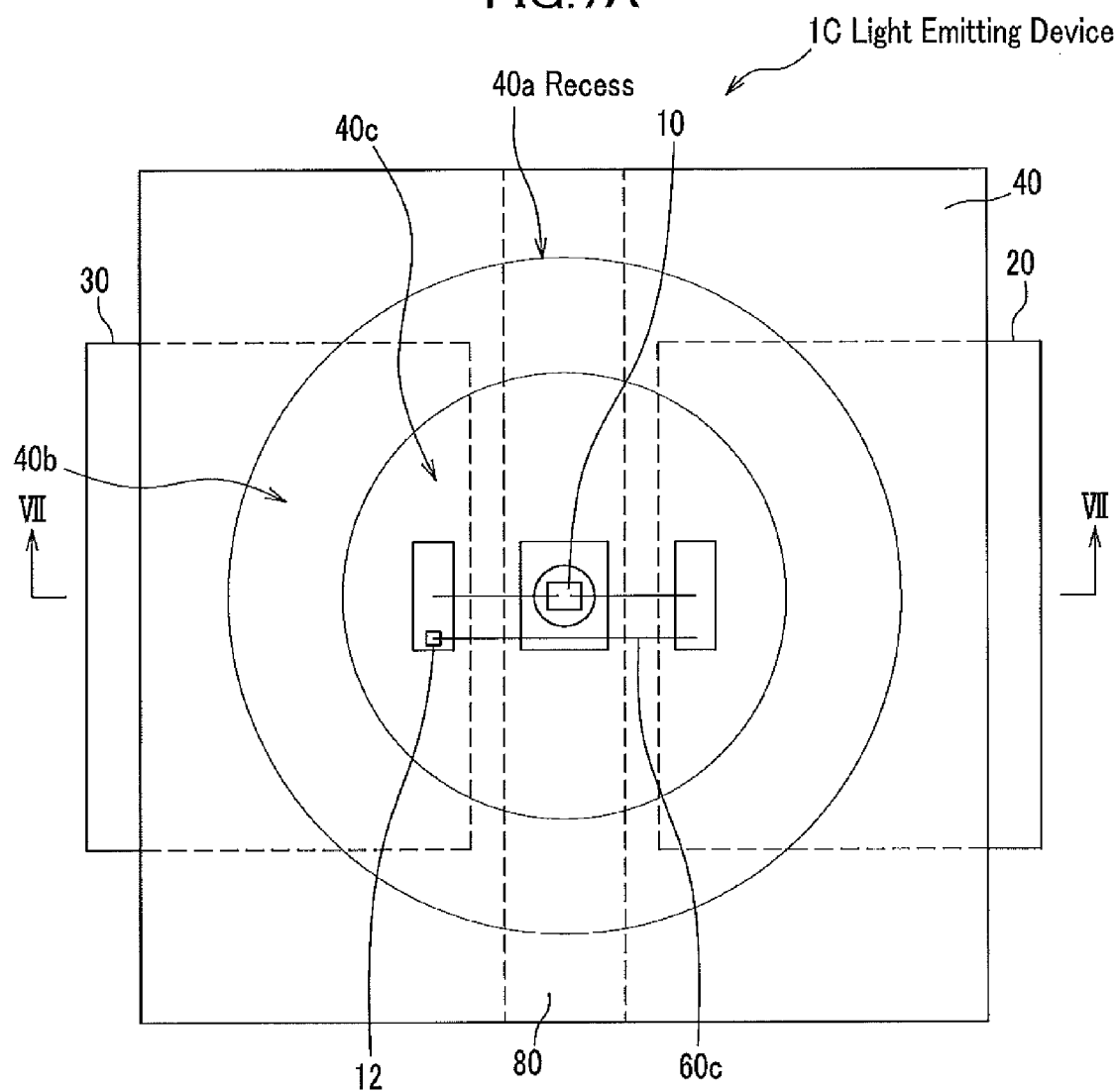
FIGS. 7A and 7B are schematic diagrams showing a construction of the light emitting device of the fourth embodiment of the present invention.
Figure 7B:
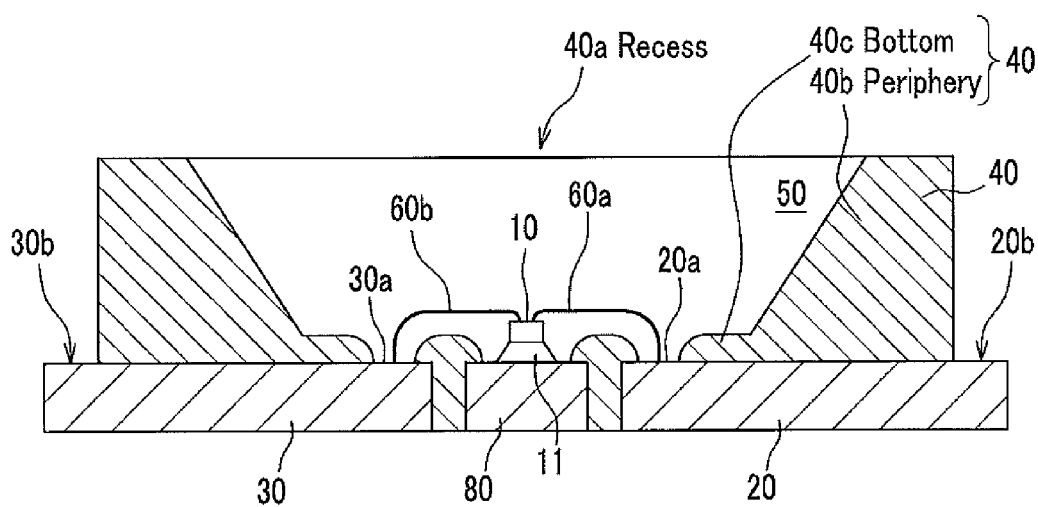

FIGS. 7A and 7B are schematic diagrams showing a construction of the light emitting device of the fourth embodiment of the present invention. FIG. 7A is a plan view of the light emitting device observed from a main light emitting surface side. FIG. 7B is a VII-VII line cross-sectional diagram of FIG. 7A. The light emitting device 1C of the forth embodiment further includes a base 80 in addition to first and second lead frames 20 and 30. The light emitting device 1C of the fourth embodiment including the base 80, has the same construction as the light emitting device 1 of the first embodiment except for a difference in shapes of the first lead and the second lead frames 20 and 30. Therefore, the same numbers are used in FIGS. 7A and 7B as in FIGS. 1A and 1B, and similar explanations will be omitted. The base 80 is provided between the first lead frame 20 and the second lead frame 30. The light emitting element 10 is mounted on the base 80. A shape of the base 80 is rectangular when the base 80 is observed from a main surface side as shown in FIG. 7A, while a variety of shapes such as pillar and conic shapes can be used. Further, the base 80 can be provided so that heat generated by the light emitting element 10 is easily radiated to the outside. For a material of the base 80, it is possible to use the same material as the first and the second lead frames 20 and 30, and to use a plate shaped material for which the same stamping process is performed as the first and the second lead frames 20 and 30. Alternatively, it is also possible to use a different material with a different thickness from the first and the second lead frames 20 and 30. As a material of the base 80, copper or iron is preferable due to a good heat dissipation property. Additionally, metal materials such as aluminum, silver, gold, and their alloys, and a resin material such as an epoxy resin can be used. Further, preferably, the base 80 made of copper or iron is plated with silver or gold in order to increase a reflection index of light emitted from the light emitting element 10. Here, even if the base 80 is provided, the base 80, mounting regions of the light emitting element 10, and mounting regions of the wires 60a and 60b on the first and the second lead frames 20 and 30, are not covered by the first resin forming body 40. Preferably, corners (edge portions) of the bottom 40c of the first resin forming body 40 are formed in a round shape (R surface), or inclinations (tapers) are formed thereon. There are two preferable reasons to form the bottom 40c in the shape as mentioned above. One is that it is possible to improve a light extraction efficiency from the light emitting element 10. The other is that it is possible to improve mold releasing of the forming body 40 from molds in resin formation. Here, in FIG. 7B, the bottom 40c of the first resin forming body 40 has round shaped corners (edge portions).

Fifth Embodiment

Figure 8A:
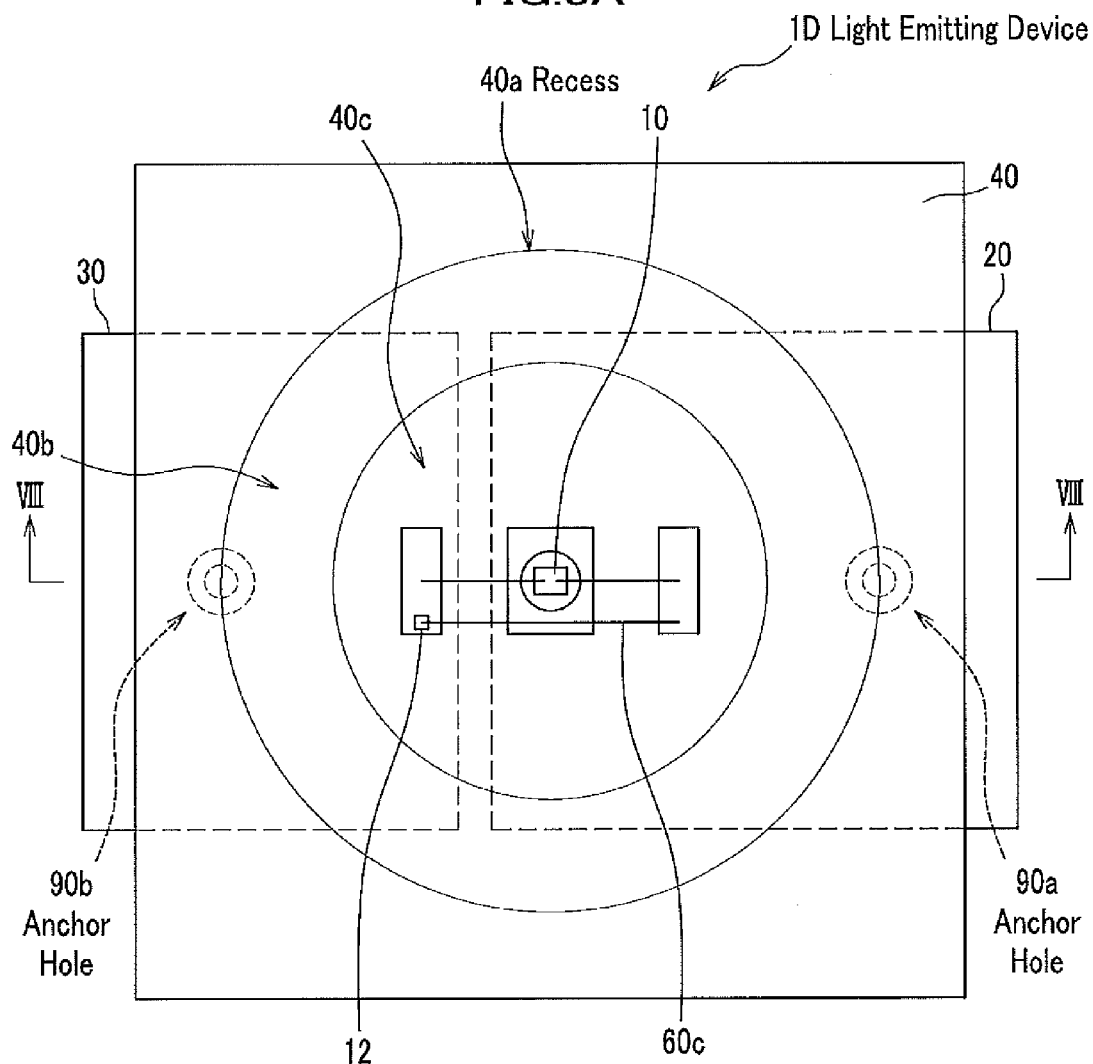
FIGS. 8A and 8B are schematic diagrams showing a construction of the light emitting device of the fifth embodiment of the present invention.
Figure 8B:
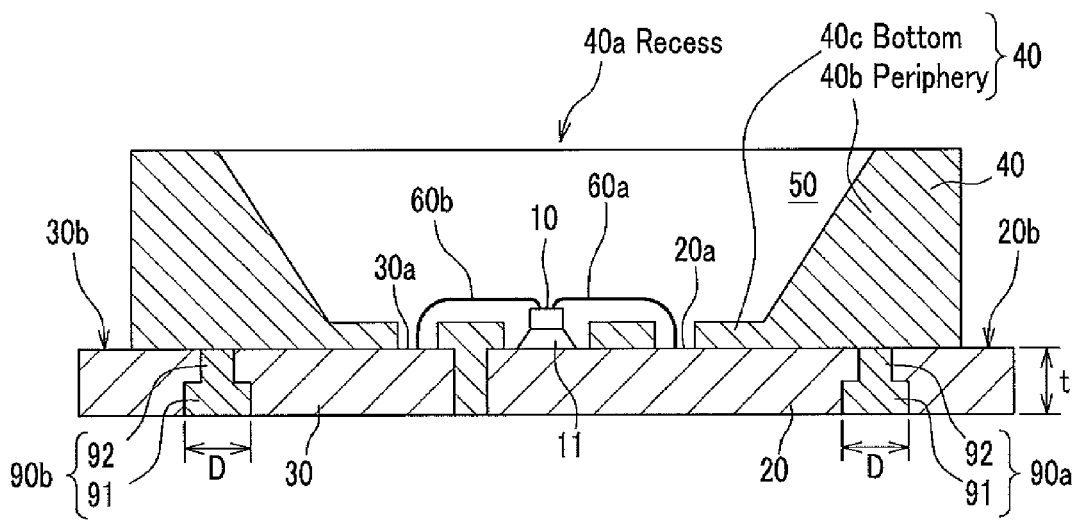

FIGS. 8A and 8B are schematic diagrams showing a construction of the light emitting device of the fifth embodiment of the present invention. FIG. 8A is a plan view of the light emitting device observed from a main light emitting surface side. FIG. 8B is a VIII-VIII line cross-sectional diagram of FIG. 8A. The light emitting device 1D of the fifth embodiment further includes an anchor hole 90a in the first lead frame 20 and an anchor hole 90b in the second lead frame 30. The light emitting device 1D of the fifth embodiment has the same construction as the light emitting device 1 of the first embodiment except for a difference that the anchor holes 90a and 90b are provided with the first lead and the second lead frames 20 and 30. Therefore, the same numbers are used in FIGS. 8A and 8B as in FIGS. 1A and 1B, and similar explanations will be omitted. As shown in FIG. 8A, the anchor holes 90a and 90b are round wells in a plan view, and include a large diameter portion 91 at a rear surface side and a small diameter portion 92 at a main surface side. A diameter D of the large diameter portion 91 is preferably equal or larger than a thickness (t) of the first and the second lead frames 20 and 30 (that is, D≧t) so that a pressing process for the first and the second lead frames 20 and 30 can be easily conducted. Here, if the anchor holes 90a and 90b have pillar shapes, preferably, the diameters of the anchor holes are equal or larger than the thicknesses (t) of the anchor holes. In the above explanations, the anchor holes 90a and 90b are described as round wells in a plan view. However, the shapes are not restricted to a particular shape. For example, a rectangular shaped well or a polygon shaped well can be used for the anchor holes 90a and 90b.

The first resin forming body 40 is filled respectively in the anchor holes 90a and 90b. The anchor holes 90a and 90b are arranged just below the periphery 40b of the first resin forming body 40 which is on the first and the second lead frames 20 and 30. Hereby, it is possible of the first resin forming body filled in the anchor holes 90a and 90b to improve an adhesive property of the periphery 40b of the first resin forming body 40 that is placed on the first and the second lead frames 20 and 30, for the first and the second lead frames 20 and 30. Therefore, it is possible of the light emitting device 1D to improve an adhesive property between the first resin forming body 40 and the second resin forming body 50. For example, if a different material (for example, a silicone resin) from that of the first resin forming body 40 is used for the second resin forming body 50, a deformation caused by thermal expansion and thermal shrinkage is larger than a deformation caused when the same material is used. However, in such a case, it is possible to preferably prevent the first resin forming body 40 from peeling off the first and the second lead frames 20 and 30 on which the first resin forming body 40 is provided, and to preferably prevent the second resin forming body 50 from peeling off the first resin forming body 40. By preventing the peeling as mentioned above, it is possible to prevent a color of plated films from changing, caused by intrusion of outer air and moisture. Further, it is also possible to prevent a light extraction efficiency from decreasing, caused by a light absorption on a peeling surface. As a result, a reliability of the light emitting device 1D can be maintained for a long period.

A shape, position, and the numbers of the anchor holes 90a and 90b in FIGS. 8A and 8B are shown as an example, but are not limited to the example. Hereinafter, modified examples in which the shape, position, and the numbers of the anchor holes are modified will be described in the sixth, seventh and eighth embodiments.

Sixth Embodiment

Figure 9A:
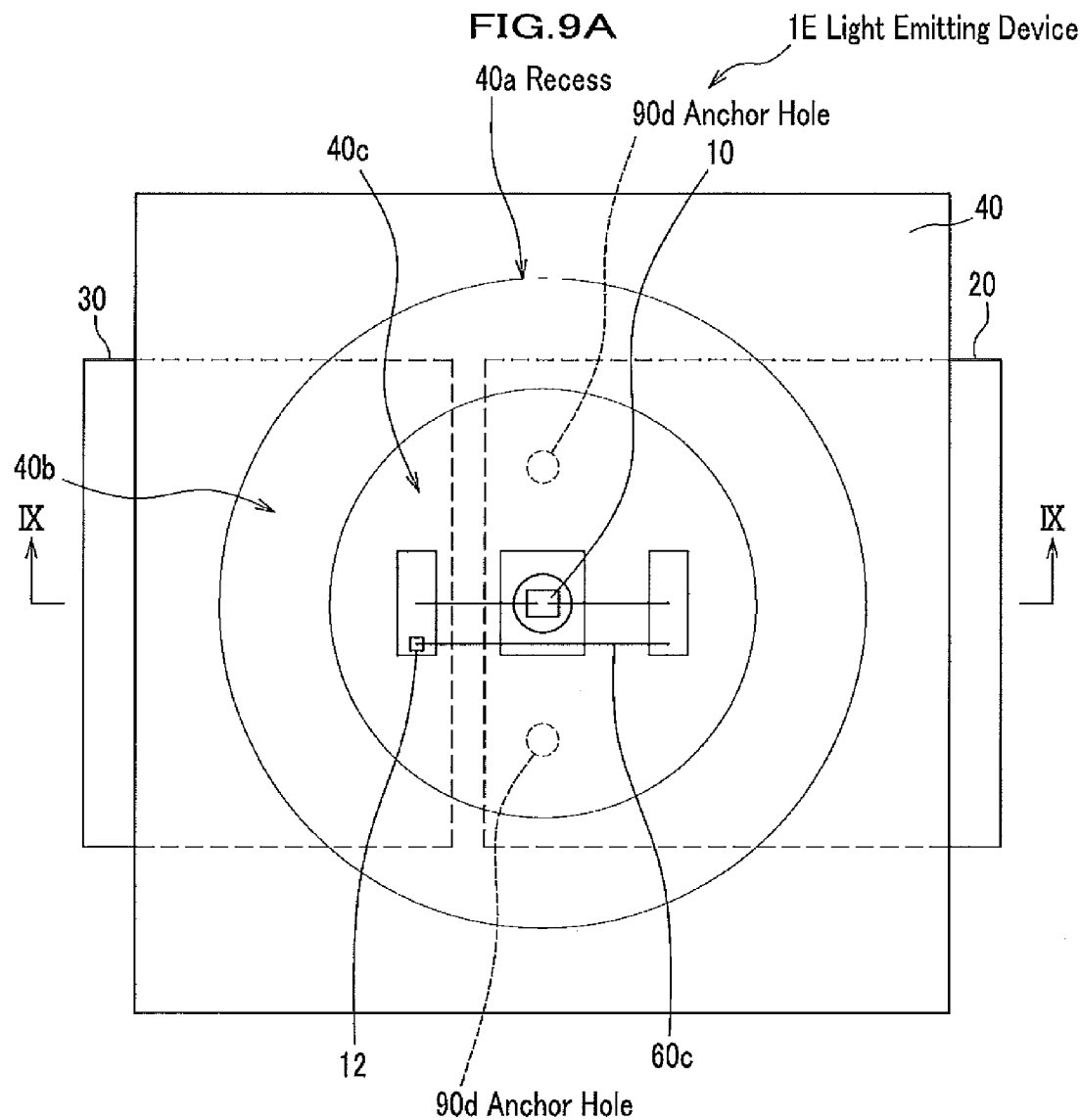
FIGS. 9A and 9B are schematic diagrams showing a construction of the light emitting device of the sixth embodiment of the present invention.
Figure 9B:
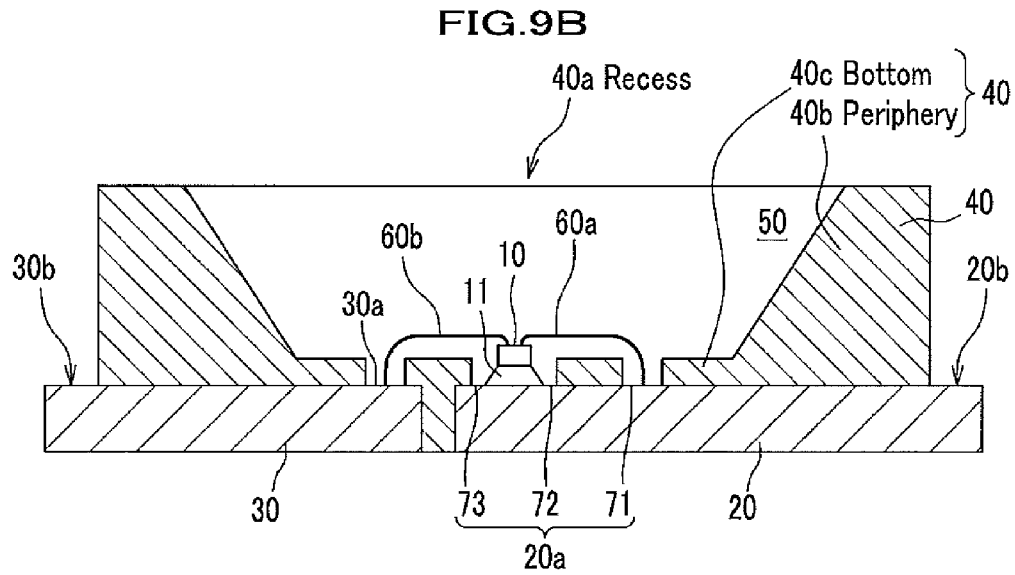

FIGS. 9A and 9B are schematic diagrams showing a construction of the light emitting device of the sixth embodiment of the present invention. FIG. 9A is a plan view of the light emitting device observed from a main light emitting surface side. FIG. 9B is a IX-IX line cross-sectional diagram of FIG. 9A. The light emitting device 1E of the sixth embodiment includes pillar shaped anchor holes 90c and 90d in the first lead frame 20. The light emitting device 1D of the fifth embodiment has the same construction as the light emitting device 1 of the first embodiment except for a difference that the pillar shaped anchor holes 90c and 90d are provided with the first lead frame 20. Therefore, the same numbers are used in FIGS. 9A and 9B as those in FIGS. 1A and 1B, and similar explanations will be omitted. The first resin forming body 40 is filled respectively in the anchor holes 90c and 90d. The anchor holes 90c and 90d are arranged just below the bottom 40c of the recess 40a the first resin forming body 40 that is placed on the first lead frame 20. Herein, preferably, the anchor holes 90c and 90d are provided at positions near the first inner lead 20a as close as possible since outer air and moisture easily enter via exposed portions (first inner lead 20a) of the first lead frame 20 that are exposed from the bottom 40c of the recess 40a of the first resin forming body 40. Hereby, it is possible of the first resin forming body 40 filled in the anchor holes 90c and 90d to improve an adhesiveness property of the bottom 40c of the first resin forming body 40 that is placed on the first lead frame 20, for the first lead frame 20. Herein, the anchor holes 90c a and 90d may be provided at the place just below the bottom 40c of the recess 40a of the first resin forming body 40 that is placed on the second lead frame 30. Hereby, it is possible to improve an adhesive property between the bottom 40c of the first resin forming body 40 that is placed on the second lead frame 30 and the second lead frame 30.

Seventh Embodiment

Figure 10A:
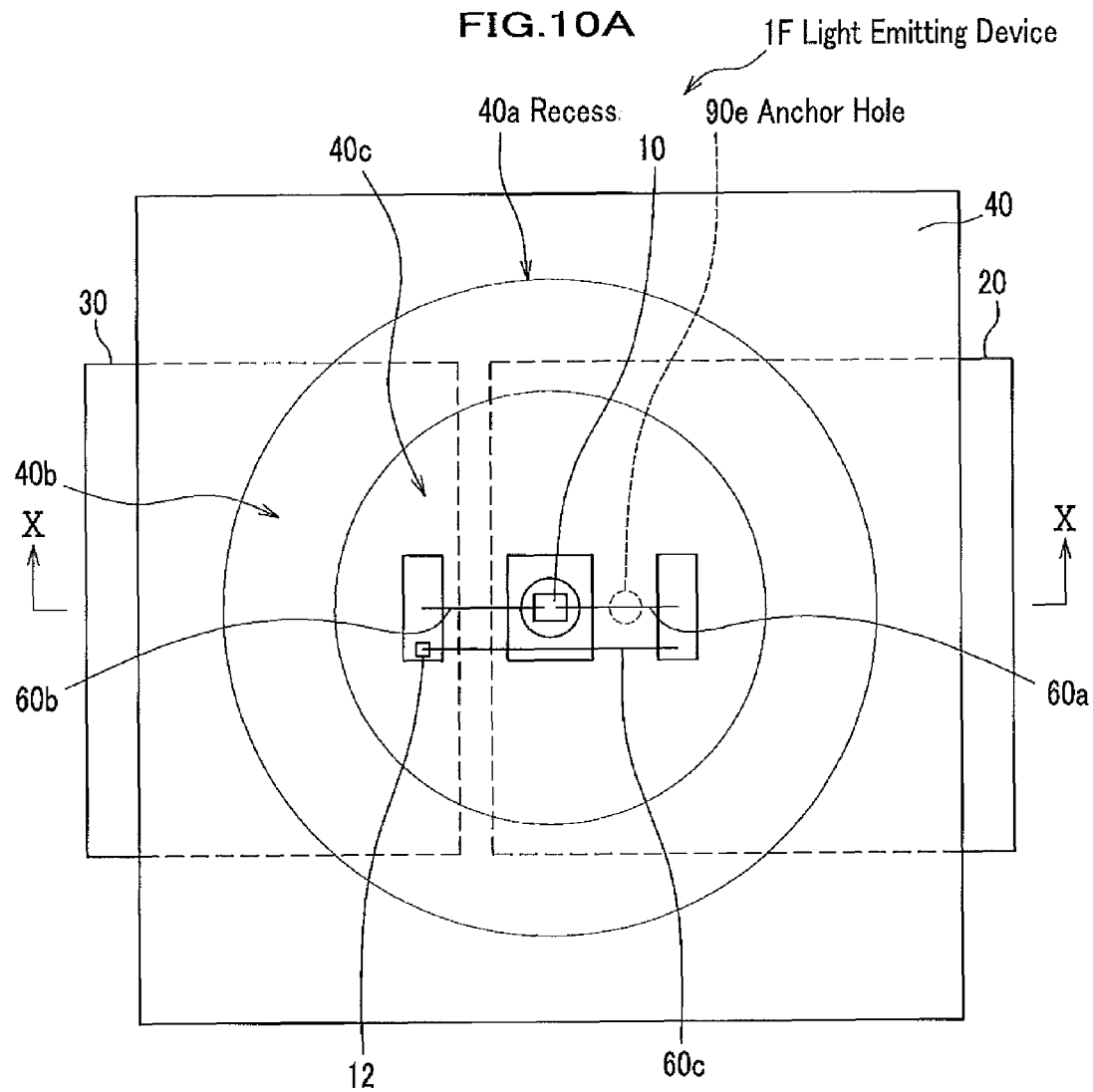
FIGS. 10A and 10B are schematic diagrams showing a construction of the light emitting device of the seventh embodiment of the present invention.
Figure 10B:
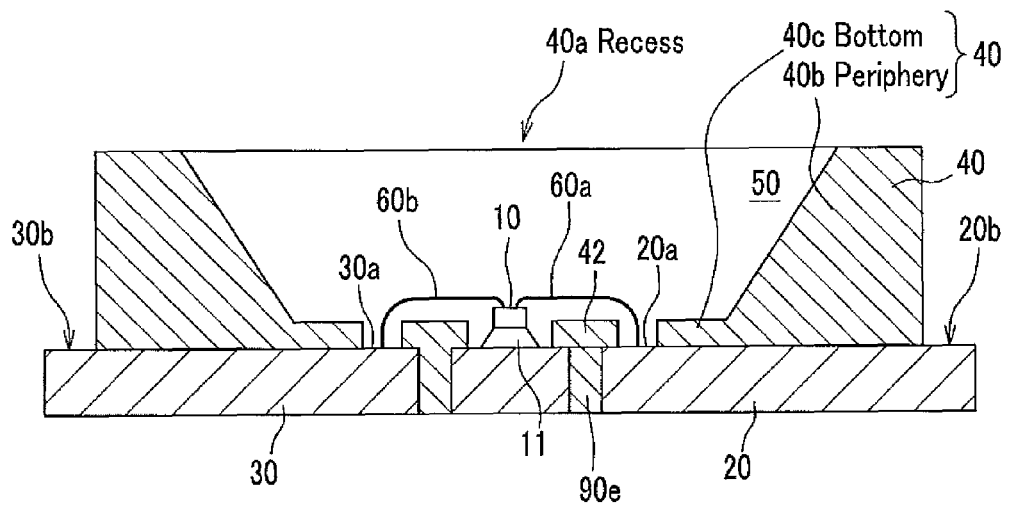

FIGS. 10A and 10B are schematic diagrams showing a construction of the light emitting device of the seventh embodiment of the present invention. FIG. 10A is a plan view of the light emitting device observed from a main light emitting surface side. FIG. 10B is a X-X line cross-sectional diagram of FIG. 10A. The light emitting device 1F of the seventh embodiment includes a pillar shaped anchor hole 90e in the first lead frame 20. The light emitting device 1F of the seventh embodiment has the same construction as the light emitting device 1 of the first embodiment except for a difference that the pillar shaped anchor hole 90e is provided with the first lead frame 20. Therefore, the same numbers are used in FIGS. 10A and 10B as in FIGS. 1A and 1B, and similar explanations will be omitted. The first resin forming body 40 is filled in the anchor hole 90e. The anchor hole 90e is arranged at a place just below the bottom 40c of the recess 40a of the first resin forming body 40 that is placed on the first lead frame 20, and near the straight line connecting the light emitting element 10 and the wire 60c. Generally, in a manufacturing process of the light emitting device such as a die-bonding process in which the light emitting element 10 is mounted on the first lead frame 20, a wire-bonding process in which the light emitting element 10 is electrically connected to the first and the second lead frames 20 and 30 through the wires 60a and 60b, a load is applied to the first and the second lead frames 20 and 30. Hereby, the first resin forming body 40 easily peels off the first and the second lead frames 20 and 30. Here, in case of the light emitting device 1F, since the anchor hole 90e is provided, it is possible to prevent the first resin forming body 40 from peeling off the first lead frame 20 in the preparation of the light emitting device 1F. Further, the anchor hole 90e is arranged at a place just below the bottom 40c of the recess 40a of the first resin forming body 40 that is placed on the second lead frame 30, and near the straight line connecting the light emitting element 10 and the wire 60b. Hereby, it is possible to improve an adhesive property between the bottom 40c of the first resin forming body 40 that is placed on the second lead frame 30 and the second lead frame 30.

Eighth Embodiment

Figure 11A:
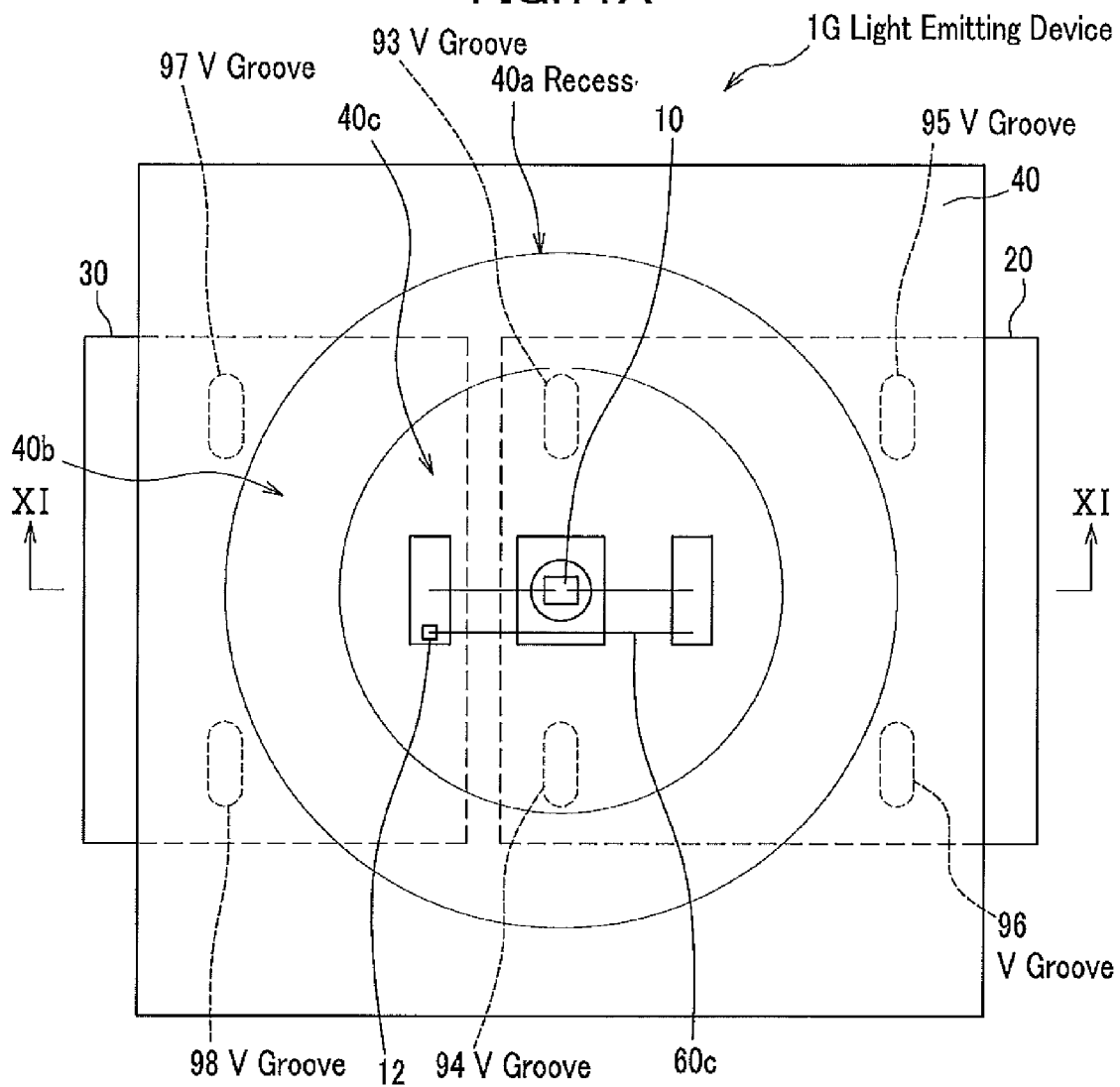
FIGS. 11A and 11B are schematic diagrams showing a construction of the light emitting device of the eighth embodiment of the present invention.
Figure 11B:
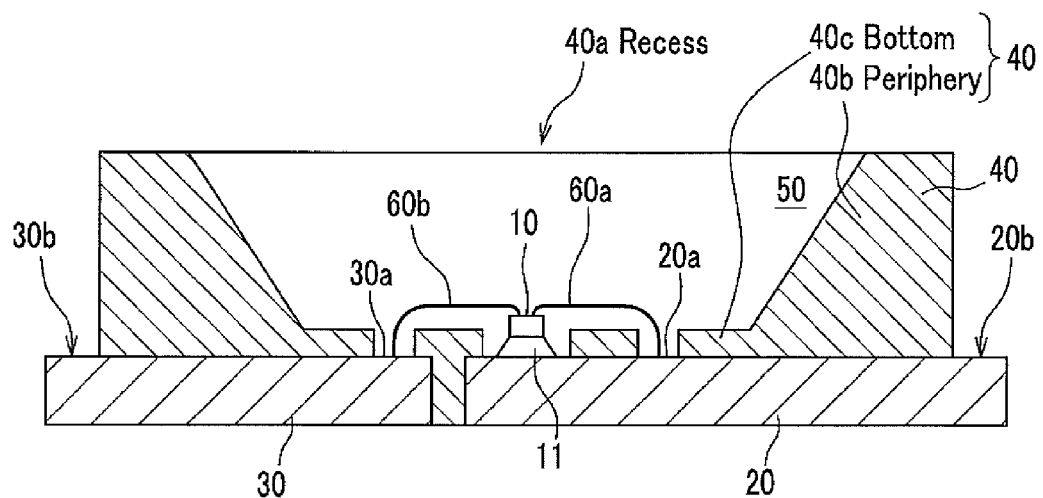
Figure 12A:
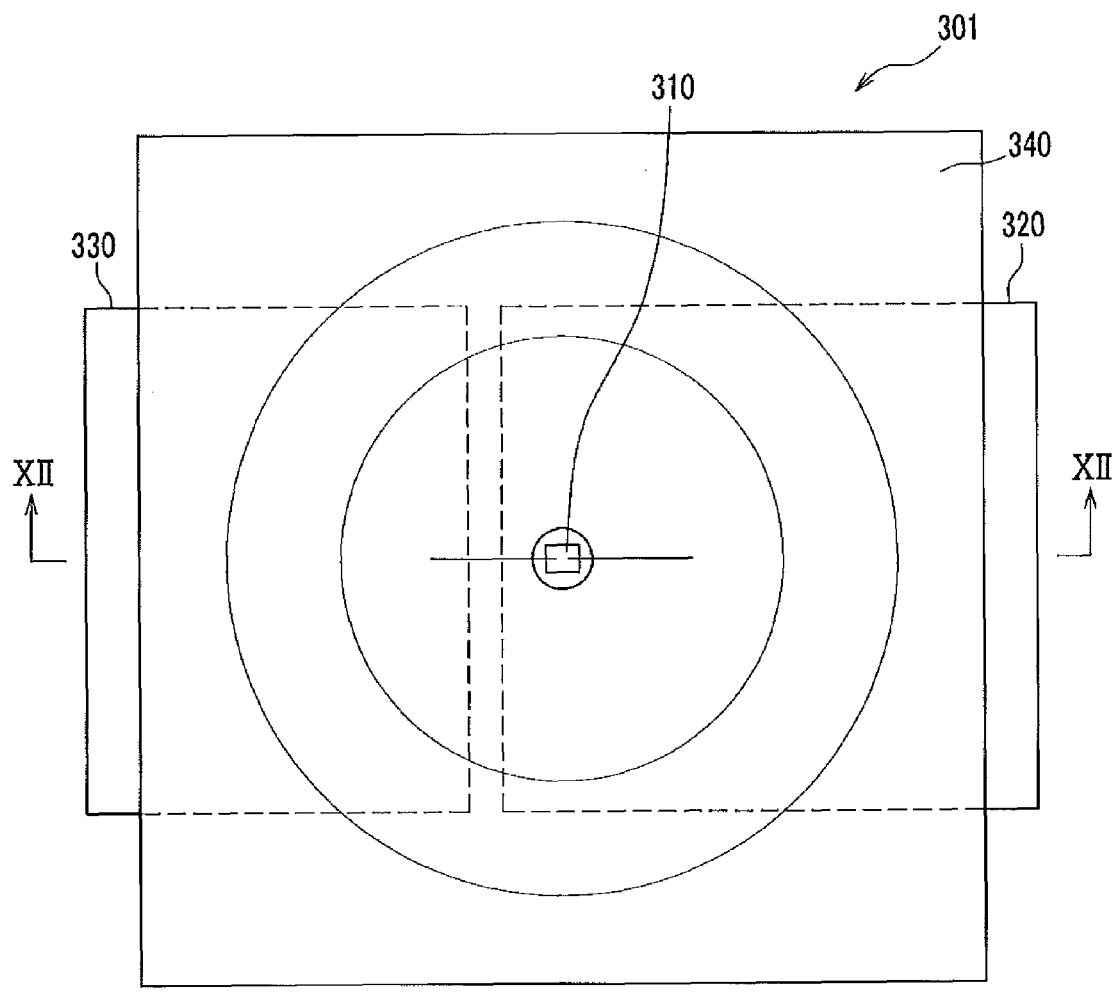
FIGS. 12A and 12B are schematic diagrams showing a construction of a conventional light emitting device.
Figure 12B:
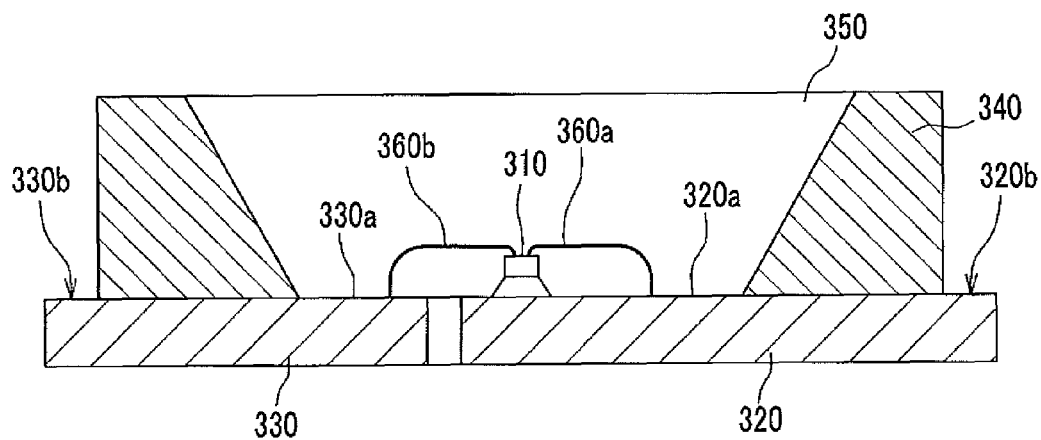

FIGS. 11A and 11B are schematic diagrams showing a construction of the light emitting device of the eighth embodiment of the present invention. FIG. 11A is a plan view of the light emitting device observed from a main light emitting surface side. FIG. 11B is a XI-XI line cross-sectional diagram of FIG. 11A. The light emitting device 1G of the eighth embodiment includes a non-penetrating groove in place of an anchor hole which penetrates the first lead frame 20 or the second lead frame 30. The light emitting device 1G of the eighth embodiment has the same construction as the light emitting device 1D of the fifth embodiment or the light emitting device 1E of the sixth embodiment except for a difference that the non-penetrating groove is provided with the first lead frame 20 or the second lead frame 30. Therefore, the same numbers are used in FIGS. 11A and 11B as those in FIGS. 8A, 8B, 9A, and 9B, and similar explanations will be omitted. For example, V grooves 93, 94, 95, and 96 are provided with the first lead frame 20, which have V shaped cross-sections in a side view and linear shapes in a plan view. Similarly, V grooves 97 and 98 are provided with the second lead frames 30. The first resin forming resin 40 is filled respectively in the V grooves 93 to 98. Among theses V grooves, the V grooves 93 and 94 are arranged at the same positions as the anchor holes 90c and 90d shown in FIG. 9A, and can show the same effect. Further, the V grooves 95 and 96 are arranged just below the bottom 40c of the recess 40a of the first resin forming body 40 that is placed on the first lead frame 20 as putting the anchor hole 90a shown in FIG. 8A, and can provide the same effect as the anchor holes. Furthermore, the V grooves 97 and 98 are arranged just below the bottom 40c of the recess 40a of the first resin forming body 40 that is placed on the first lead frame 20 as putting the anchor hole 90b shown in FIG. 8A, and can provide the same effect as the anchor holes. As a result, by forming the V graves 93 to 98 as mentioned above, it is possible to adjust a flow of the resin in a preparation of the first resin forming body 40. Hereby, it is possible to prevent a positional gap in a right-left direction (horizontal direction) and in an up-down direction (vertical direction) in FIG. 11A. Here, it is possible to change the number, a length, a width, a thickness of the respective V grooves 93 to 98 appropriately. Although the V graves 93 to 98 are shown to be formed in an up-down direction (vertical direction), the V graves 93 to 98 can be formed in a right-left direction (horizontal direction) or other directions. Further, a V groove having a curved line shape in a plan view can be formed in place of a V groove having a linear line shape in a plan view. Further, a cross-sectional shape of the V groove can be a U shape. Further, the anchor holes 90a, 90b, 90c, 90d, and 90e shown in FIG. 8A to 10A can be used together with the V grooves.

As mentioned above, the respective embodiments have been described. However, the present invention is not limited to such embodiments, and alternation and modification of the embodiments within the scope of the invention are possible. For example, a manufacturing method of the light emitting device of the respective embodiments is described as the bottom 40c and the periphery 40b of the first resin forming body 40 are integratedly formed. However, the present invention is not limited to the description, and it is possible to separately form the bottom 40c and the periphery 40b of the first resin forming body 40. In this case, for example, it is possible to form only the periphery 40b by using conventional molds so that a bottom surface of the recess 40a of the first resin forming body 40 is completely exposed, then to mask predetermined regions of the first and the second lead frames 20 and 30 which are exposed from the recess 40a, and afterward to coat the first thermosetting resin to form the bottom 40c. By this method, it is possible to flexibly change designs of, for example, a thickness of the bottom 40c and an area of masking regions.

The light emitting device of each embodiment is described as the light emitting element 10 comprises a pair of positive and negative electrodes on the same surface. Alternatively, it is possible to use a light emitting element having a pair of positive and negative electrodes respectively on an upper side surface and a down side surface of the light emitting element. In this case, the electrode on the down surface of the light emitting element is electrically connected without using a wire to the first lead frame 20 by using a die bond member having an electrical conductivity.

Further, the light emitting device of each embodiment is described as it includes one light emitting element 10, and a pair of a first lead frame 20 and a second lead frame 30. Alternatively, it is possible that the light emitting device includes a plurality of the light emitting elements 10, and a plurality of the first lead frames 20 and the second lead frames 30 which correspond to the respective light emitting elements 10. Further, it is possible that the light emitting device includes one or more lead frames mounting the light emitting element 10, and two and more lead frames which play as positive and negative electrodes, the lead frames being independent of the lead frames mounting the light emitting element 10.

Further, in each embodiment, as shown in FIG. 1A, a shape of the first resin forming body 40 at the main surface side is shown as rectangular. Alternatively, it is possible that the shape is polygonal such as pentagonal or round such as circular or oval. Furthermore, a shape of the recess 40a of the first resin forming body 40 of the main surface side is shown as circular, it is possible that the shape is oval, near circular, rectangular, and polygonal such as pentagonal. Moreover, a cathode mark may be attached to the main surface side of the first resin forming body as a mark of a cathode of the light emitting element 10.

Here, a material mixed with the first resin forming body 40 is not limited to a material described in each embodiment. For example, at least a material selected from a group consisting of a light shielding substance, a diffusing agent, a pigment, a fluorescent substance, a reflecting substance can be used can be used for the material to be mixed. By mixing a light shielding substance, it is possible to reduce light which penetrates the first resin forming body 40. Further, by mixing a diffusing agent, it is possible to uniformly radiate light of the light emitting device mainly in front and side directions. Further, by adding a white color pigment, it is possible to reduce light absorption.

Further, it is possible that an insulating member is coated thin to cover a gap between the first lead frame 20 and the second lead frame 30 at the rear surface side of the light emitting element 10. In this case, the insulating member is composed of a resin such as an epoxy resin sheet having an electrical insulating property. The insulating member can prevent the first outer lead 20b and the second outer leas 30 from short-circuiting each other via solder.

<Fluorescent Substance>

In each embodiment, a fluorescent substance to be mixed with the second resin forming body 50 is described as a substance which absorbs light of the light emitting element 10 and converts a wavelength of the light to a different wavelength, without showing detailed examples. Hereinafter, the preferable examples of the fluorescent substance will be described in detail. That is, preferably, the fluorescent substance includes at least one or more substances selected from a group consisting of nitride, oxynitride, and sialon fluorescent bodies which are activated mainly by a lanthanoid element such as Eu and Ce, an alkaline earth metal halogen apatite fluorescent body activated mainly by a lanthanoid element such as Eu and a transition metal element such as Mn, an alkaline earth metal borate halogen fluorescent body, an alkaline earth metal alminate fluorescent body, an alkaline earth metal silicate, an alkaline earth metal sulfide, an alkaline earth metal thiogallate, an alkaline earth metal nitride silicon, a germanate, a rare earth metal alminate activated mainly by a lantanoid element such as Ce, and an organic or inorganic complex activated mainly by a rare earth metal silicate or a lantanoid element such as Eu. More specifically, the fluorescent bodies shown below can be used, but the present invention is not limited to the examples.

A nitride fluorescent body activated mainly by a lantanoid element such as Eu and Ce includes $M_2Si_5N_8$:Eu and $CaAlSiN_3$:Eu (M represents at least one or more elements selected from Sr, Ca, Ba, Mg, and Zn). Further, the nitride fluorescent body includes $MSi_7N_{10}$:Eu and $M_{1.8}Si_5O_{0.2}N_8$:Eu, and $M_{0.9}Si_7O_{0.1}N_{10}$:Eu (M represents at least one or more elements selected from Sr, Ca, Ba, Mg, and Zn).

An oxynitride fluorescent body activated mainly by a lantanoid element such as Eu and Ce includes $MSi_2O_2N_2$:Eu (M represents at least one or more elements selected from Sr, Ca, Ba, Mg, and Zn).

A sialon fluorescent body activated mainly by a lantanoid element such as Eu and Ce includes $M_{p/2}Si_{12-p-q}Al_{p-q}O_q N_{16-p}$:Ce, and M—Al—Si—O—N (M represents at least one or more elements selected from Sr, Ca, Ba, Mg, and Zn, q=0-2.5, and p=1.5-3).

An alkaline rare metal halogen apatite fluorescent body activated mainly by a lantanoid element such as Eu or a transition metal element such as Mn includes $M_5(PO_4)_3X$:R (M represents at least one or more elements selected from Sr, Ca, Ba, Mg, and Zn. X represents at least one or more elements selected from F, Cl, Br, and I. R represents one or more elements selected from Eu, Mn, Eu and Mn).

An alkaline earth metal borate halogen fluorescent body includes $M_2B_5O_9X$:R (M represents at least one or more elements selected from Sr, Ca, Ba, Mg, and Zn. X represents at least one or more elements selected from F, Cl, Br, and I. R represents one or more elements selected from Eu, Mn, Eu and Mn).

An alkaline rare metal aluminate fluorescent body includes $SrAl_2O_4$:R, $Sr_4Al_{14}O_{25}$:R, $CaAl_2O_4$:R, $BaMg_2Al_{16}O_{27}$:R $BaMg_2Al_{16}O_{12}$:R, $BaMgAl_{10}O_{17}$:R (R represents one or more elements selected from Eu, Mn, Eu and Mn).

An alkaline earth sulfide fluorescent body includes $La_2O_2S$:Eu, $Y_2O_2S$:Eu, $Gd_2O_2S$:Eu.

A rare earth aluminate fluorescent body activated mainly by a lantanoid element such as Ce includes a YAG fluorescent body having a composition formulation as $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, $(Y, Gd)_3(Al, Ga)_5O_{12}$:Ce. Further, the rare earth aluminate fluorescent body includes $Tb_3Al_5O_{12}$:Ce, and $Lu_3Al_5O_{12}$:Ce in which a part of Y or all of Y is replaced by Tb or Lu.

Other fluorescent forming body includes ZnS:Eu, Zn2GeO4:Mn, $MGa_2S_4$:Eu (M represents at least one or more elements selected from Sr, Ca, Ba, Mg, and Zn. X represents at least one or more elements selected from F, Cl, Br, and I).

The fluorescent forming body can includes one or more elements selected from Tb, Cu, Ag, Au, Cr, Nd, Dy, Co, Ni, and Ti, by replacing Eu or by adding these elements to Eu as desired.

Alternatively, a fluorescent forming body except for the above mentioned fluorescent forming body, having the same performance and effect as the above mentioned fluorescent, can be also used.

For these fluorescent forming bodies, it is possible to use a fluorescent forming body having an emission spectrum in yellow, red, green and blue by an exciting light of the light emitting element 10. Further, it is also possible to use a fluorescent forming body having an emission spectrum in yellow-green, yellow-red, and blue-green which are intermediate colors of yellow, red, green, and blue. It is possible to produce a light emitting device having a variety of light emitting colors by using theses fluorescent forming bodies in combination.

For example, by using a GaN compound semi-conductor emitting blue light, a wavelength conversion is performed by irradiating the light to a fluorescent substance such as $Y_3Al_5O_{12}$:Ce, or $(Y_{0.8}Gd_{0.2})_3Al_5O_{12}$:Ce. It is possible to provide a light emitting device that emits white light by mixing light from the light emitting element 10 and light from the fluorescent substance.

For example, it is possible to provide a light emitting device that emits white light with improved color rendering properties, by using a fluorescent body comprising $CaSi_2O_2N_2$:Eu emitting green to yellow light, $SrSi_2O_2N_2$:Eu, $(Sr, Ca)_5(PO_4)_3Cl$:Eu emitting blue light, $(Ca, Sr)_2Si_5N_8$:Eu emitting red light. Since the three complete primary colors: red, blue and green are used, it is possible to realize desired white light only by changing a composition rate of a first fluorescent body and a second fluorescent body.

Example

In order to confirm effects of the present invention, a light emitting device of the first embodiment is produced by a manufacturing method of the light emitting device of the first embodiment. For example, the same shaped spaces as the periphery 40b and the bottom 40c of the first resin forming body 40 are formed on the upper mold composing molds to form a housing which are, beforehand, separately formed for the upper mold and the lower mold. In the same time, the first thermosetting resin to form the first resin forming body 40 is prepared. Then, by using the upper mold 201 and the lower mold 202 in which the spaces are formed, the prepared first thermosetting resin, and the second thermosetting resin prepared beforehand, the light emitting device 1 is produced according to the manufacturing steps shown in FIGS. 4A to 4F.

<Material of First Thermosetting Resin>

The first thermosetting resin to form the first resin forming body 40 is composed of an epoxy resin (A) listed in Table 1 and a mixture listed in Table 2, when classified generally.

TABLE 1

| | | | Trade Name/ | Epoxy |
|---|---|---|---|---|
| A | Type | Component | Manufacturer | Equivalent |
| A1 | Triazine Derivative Epoxy Resin | 1,3,5,- tris(2,3- Epoxypropyl) isocyanate | TIPIC$^R$-S/ Nissan Chem. Ind. Ltd. | 100 |
| A2 | Hydrogenated Epoxy Resin | Bisphenol A type hydrogenated epoxy resin | YL- 7170/Japan Epoxy Resin KK. | 1200 |
| A3 | Other Aromatic Epoxy Resin | Bisphenol A type epoxy resin | E1004/Japan Epoxy Resin KK | 890 |

TABLE 2

| Mixed Agent and Type | | Component | Trade Name/ Manufacturer |
|---|---|---|---|
| B | | Acid Anhydride | |
| B1 | Carbon Carbon Double Bond Non Contained Acid Anhydride | Methylhexahydrophthalic acid anhydride | RIKACID$^R$ MH/ New Japan Chem. Co. Ltd. |

TABLE 2-continued

| Mixed Agent and Type | | Component | Trade Name/ Manufacturer |
|---|---|---|---|
| B2 | Carbon Carbon Double Bond Contained Acid Anhydride | Tetrahydrophtalic acid anhydride | RIKACID$^R$ MH/ New Japan Chem. Co. Ltd. |
| C | | Antioxidant | |
| C1 | Phosphorous Based Antioxidant | Triphenyl phosphite | Wako Pure Chem. Ind. Ltd. |
| C2 | Phenol Based Antioxidant | 2,6-Di-t-butyl-p- cresol | BHT/Wako Pure Chem. Ind. Ltd. |
| D | Light Reflector | Rutile-type titanium dioxide | TIPAQUE$^R$ "CR- 90"/Ishihara Sangyo Ltd |
| E | Inorganic Filler | Broken fused silica | Tatsumori KK |
| F | | Curing Catalyst | |
| F1 | Phosphorous Based Curing Catalyst | Methyl- tributylphosphonium- dimethylphosphate | PX-4MP/Nippon Chem. Ind. Ltd |
| F2 | Imidazole Based Catalyst | 2-Ethyl-4- methylimidazole | 2E4MZ/Shikoku Chem. Co. |

As shown in Table 1, an epoxy resin (A) includes a triazine derivative epoxy resin (A1), a hydrogenated epoxy resin (A2), and other aromatic epoxy resin (A3).

Further, an agent to be mixed with the epoxy resin in Table 2 includes an acid anhydride (B), an antioxidant (C), a light reflector (D), an inorganic filler (E), and a curing catalyst (F). More, specifically, the acid anhydride (B) includes a carbon-carbon double bond non-contained acid anhydride (B1) and a carbon-carbon double bond contained acid anhydride (B2). The antioxidant (C) includes a phosphorous passed antioxidant (C1) and a phenol based antioxidant (C2). The curing catalyst (F) includes a phosphorous based curing catalyst (F1) and an imidazole based catalyst (F2).

<Preparation of First Thermosetting Resin>

The epoxy resin (A) in Table 1, and the acid anhydride (B) and the antioxidant (C) in Table 2 are fusion mixed in a reaction vessel at 80° C. for 5 hours. After cooling and becoming solid, the solid is crashed to obtain a primary product. The primary product is added to a mixture of the light reflector (D), the inorganic filler (E), the curing catalyst (F) shown in Table 2 and a bulking agent in a predetermined composition rate, and the mixture is uniformly melting mixed by heat two-roll. After cooling, the product is crashed to produce the first thermosetting resin. Accordingly, a cured product made of a white epoxy resin composition is prepared.

<Light Emitting Element>

A light emitting element emitting blue light, which is composed of a sapphire base having an InGaN light emitting layer, is used.

<Preparation of First and Second Lead Frames>

A flat plate composed of copper alloy is punching processed, and plated with silver on the surface to produce the first lead frame 20' and the second lead frame 30'.

<Wire>

A gold wire having a diameter of 30 μm is used.

<Second Thermosetting Resin>

A resin is used, which comprises YAG fluorescent body yttrium-aluminum-garnets based fluorescent body 30 pts by mass and light expanding agent of silicon oxide 5 pts by mass, for silicon resin 100 pts by mass.

<Production of Light Emitting Device>

A forming body comprising the first lead frame 20' and the second lead frame 30' which are made of copper alloy plated with silver, and the first thermosetting resin prepared by materials in Table 1 and Table 2, is formed by a transfer molding process. Here, when the first lead frame 20' and the second lead frame 30' are fixed, the upper mold 201 and the lower mold 202 are heated at about 150° C. for about 3 minutes. Further, the molds are heated at about 150° C. for 3 hours as post curing. The second thermosetting resin is heated from a room temperature to 150° C. over 3 hours, and is cured by heating at 150° C. for 5 hours. A reflection rate of laser light having a laser wavelength of equal or more than 430 nm, is equal or more than 70%, with respect to the prepared first resin forming body 40.

Industrial Applicability

The light emitting device of the present invention can be used for an illumination apparatus, a backlight, a light emitting apparatus mounted on a vehicle, a display, an auxiliary light source for moving image illumination, and other general industrial and consumer light sources.

What is claimed is:

1. A light emitting device comprising:
   a light emitting element;
   a lead frame electrically connected to the light emitting element;
   a first resin forming body including a periphery which forms a recess for housing the light emitting element on the lead frame, and a bottom which forms a bottom portion of the recess; and
   a second resin forming body which covers the light emitting element housed in the recess of the first resin forming body,
   wherein the first resin forming body is composed of a thermosetting epoxy resin composite of which essential component is an epoxy resin, the bottom covers surfaces of the lead frame excluding a mounting region of the light emitting element and mounting regions of wires, and a thickness of the bottom is thinner than a thickness from a surface of the lead frame to a leading end of the light emitting element, and
   wherein a bottom surface of the lead frame comprises a bottom surface of the light emitting device.

2. The light emitting device according to claim 1, wherein the first resin forming body is composed of a thermosetting epoxy resin composite of which essential component is an epoxy resin including a triazine derivative epoxy resin, and the second resin forming body is composed of the same material as the first resin forming body, or a silicon included resin.

3. The light emitting device according to claim 1, wherein the first resin forming body includes a peripheral side surface surrounding a circumference of the light emitting element at the bottom, and the peripheral side surface has a predetermined inclination so that a circumference of an upper surface of the bottom is longer than a circumference of a bottom surface of the bottom.

4. The light emitting device according to claim 2, wherein the first resin forming body includes a peripheral side surface surrounding a circumference of the light emitting element at the bottom, and the peripheral side surface has a predetermined inclination so that a circumference of an upper surface of the bottom is longer than a circumference of a bottom surface of the bottom.

5. The light emitting device according to claim 1, wherein the bottom and the periphery of the first resin forming body are integratedly formed, or the bottom and the periphery of the first resin forming body are separately formed.

6. The light emitting device according to claim 2, wherein the bottom and the periphery of the first resin forming body are integratedly formed, or the bottom and the periphery of the first resin forming body are separately formed.

7. The light emitting device according to claim 1, wherein an anchor hole or a groove is provided with the first and the second lead frames, and the first resin forming body is filled in the anchor hole or the groove.

8. The light emitting device according to claim 2, wherein an anchor hole or a groove is provided with the first and the second lead frames, and the first resin forming body is filled in the anchor hole or the groove.

9. The light emitting device according to claim 1, wherein the lead frame includes an anchor hole therein.

10. The light emitting device according to claim 9, wherein the anchor hole is disposed in the lead frame below the periphery of the first resin forming body.

11. The light emitting device according to claim 9, wherein the anchor hole comprises a top portion and a bottom portion, and wherein the diameter of the top portion is smaller than the diameter of the bottom portion.

12. The light emitting device according to claim 11, wherein the diameter of the bottom portion is greater than or equal to a thickness of the lead frame.

13. The light emitting device according to claim 1, wherein the lead frame includes a plurality of grooves therein, and wherein the grooves are disposed in the lead frame below the periphery of the first resin forming body and filled with the first resin forming body.

14. The light emitting device according to claim 1, wherein a surface of the lead frame comprises silver.

15. The light emitting device according to claim 1, wherein a bottom surface of the lead frame is exposed.

* * * * *